US009570004B1

(12) United States Patent
Fan

(10) Patent No.: US 9,570,004 B1
(45) Date of Patent: Feb. 14, 2017

(54) METHOD OF DRIVING PIXEL ELEMENT IN ACTIVE MATRIX DISPLAY

(76) Inventor: Nongqiang Fan, Holbrook, NY (US)

( * ) Notice: Subject to any disclaimer, the term of this patent is extended or adjusted under 35 U.S.C. 154(b) by 629 days.

(21) Appl. No.: 12/404,327

(22) Filed: Mar. 15, 2009

Related U.S. Application Data

(60) Provisional application No. 61/036,978, filed on Mar. 16, 2008.

(51) Int. Cl.

| | |
|---|---|
| ***G09G 3/30*** | (2006.01) |
| ***G09G 3/32*** | (2016.01) |
| ***G09G 3/36*** | (2006.01) |
| ***H01L 27/32*** | (2006.01) |

(52) U.S. Cl.
CPC .......... *G09G 3/3233* (2013.01); *G09G 3/3648* (2013.01); *H01L 27/3244* (2013.01); *G09G 2320/0233* (2013.01); *G09G 2320/043* (2013.01)

(58) Field of Classification Search
CPC ............ G09G 3/3225; G09G 2320/043; G09G 2300/0876; G09G 3/3233; G09G 3/3241; G09G 2300/0819; G09G 2300/0852; G09G 2310/0251; G09G 2320/045; G09G 3/3291; G09G 2310/061; G09G 3/3208; G09G 2300/043; G09G 3/3648; G09G 3/30; G09G 3/325; G09G 2300/0439; G09G 2300/0861; G09G 2320/0233; G09G 2360/148; G09G 3/3258; G09G 2300/08; H01L 27/3244; H01L 27/3269
USPC ............. 345/76, 77, 204, 92, 39, 82, 46, 55; 315/169.3, 169.1
See application file for complete search history.

(56) References Cited

U.S. PATENT DOCUMENTS

| | | | | |
|---|---|---|---|---|
| 6,229,508 | B1 * | 5/2001 | Kane | G09G 3/3233 345/205 |
| 6,414,661 | B1 * | 7/2002 | Shen | G09G 3/3208 345/46 |
| 7,071,905 | B1 * | 7/2006 | Fan | G09G 3/3233 315/169.3 |
| 7,170,232 | B2 * | 1/2007 | Miwa et al. | 315/169.3 |
| 7,253,391 | B2 * | 8/2007 | Koyama et al. | 250/214 C |
| 7,768,590 | B2 * | 8/2010 | Yagi et al. | 349/54 |
| 8,134,523 | B2 * | 3/2012 | Fish | 345/76 |
| 2001/0024186 | A1 * | 9/2001 | Kane | G09G 3/3233 345/98 |

(Continued)

FOREIGN PATENT DOCUMENTS

| | | | | |
|---|---|---|---|---|
| JP | 2007-206590 A | * | 7/2007 | G09G 3/30 |
| JP | 2007-206590 A | * | 8/2007 | G09G 3/30 |
| WO | WO 2004/066249 | * | 8/2004 | G09G 3/32 |

OTHER PUBLICATIONS

Lee, et al., Non-Patent Literature Publication, Highly Stable a-Si:H TFT Pixel for Large Area AMOLED by Employing Both Vth Storing and the Negative Bias Annealing, SID Digest 2007, p. 165-168.*

(Continued)

*Primary Examiner* — Michael J Eurice

(57) ABSTRACT

A method of driving a pixel element in a matrix of pixel elements includes (1) setting the bias voltage of a first transistor to a value that is substantially close to a threshold voltage of the first transistor by changing a voltage across a first capacitive element with a current passing through the first transistor; (2) setting the bias voltage of the first transistor to a value that is different from the threshold voltage of the first transistor; and (3) causing a change of the bias voltage of the first transistor.

27 Claims, 23 Drawing Sheets

(56) References Cited

U.S. PATENT DOCUMENTS

| | | | | |
|---|---|---|---|---|
| 2002/0027229 A1* | 3/2002 | Yamazaki | G01J 1/44 | 257/84 |
| 2003/0063081 A1* | 4/2003 | Kimura | G09G 3/3233 | 345/211 |
| 2003/0137503 A1* | 7/2003 | Kimura | H01L 27/3276 | 345/212 |
| 2004/0095298 A1* | 5/2004 | Miyazawa | G09G 3/3233 | 345/76 |
| 2004/0201581 A1* | 10/2004 | Miyazawa | G09G 3/3233 | 345/204 |
| 2005/0007320 A1* | 1/2005 | Smith | G09G 3/3233 | 345/77 |
| 2005/0067970 A1* | 3/2005 | Libsch | G09G 3/3233 | 315/169.3 |
| 2005/0078065 A1* | 4/2005 | Hayafuji | G09G 3/3216 | 345/76 |
| 2005/0082463 A1* | 4/2005 | Koyama | H01L 27/14692 | 250/214 R |
| 2005/0225519 A1* | 10/2005 | Naugler | G09G 3/3233 | 345/77 |
| 2005/0280616 A1* | 12/2005 | Miwa | G09G 3/3233 | 345/77 |
| 2006/0050040 A1* | 3/2006 | Chou | G09G 3/3233 | 345/92 |
| 2006/0077134 A1* | 4/2006 | Hector | G09G 3/3233 | 345/76 |
| 2006/0097965 A1* | 5/2006 | Deane | G09G 3/3233 | 345/76 |
| 2006/0125740 A1* | 6/2006 | Shirasaki | G09G 3/325 | 345/77 |
| 2006/0176250 A1* | 8/2006 | Nathan | G09G 3/3233 | 345/76 |
| 2006/0187153 A1* | 8/2006 | Nathan | G09G 3/3233 | 345/76 |
| 2006/0208979 A1* | 9/2006 | Fish | G09G 3/3233 | 345/81 |
| 2007/0063932 A1* | 3/2007 | Nathan | G09G 3/3233 | 345/76 |
| 2007/0063993 A1* | 3/2007 | Shishido | G09G 3/3241 | 345/175 |
| 2007/0080905 A1* | 4/2007 | Takahara | G09G 3/3233 | 345/76 |
| 2007/0080908 A1* | 4/2007 | Nathan | G09G 3/3241 | 345/77 |
| 2007/0085847 A1* | 4/2007 | Shishido | G09G 3/3233 | 345/204 |
| 2007/0091029 A1* | 4/2007 | Uchino | G09G 3/3233 | 345/76 |
| 2007/0109239 A1* | 5/2007 | den Boer | G02F 1/13338 | 345/87 |
| 2007/0164959 A1* | 7/2007 | Childs | G09G 3/3233 | 345/92 |
| 2007/0241998 A1* | 10/2007 | Fish | G09G 3/3233 | 345/76 |
| 2007/0290947 A1* | 12/2007 | Cok | G09G 3/3225 | 345/45 |
| 2007/0290957 A1* | 12/2007 | Cok | G09G 3/3225 | 345/77 |
| 2007/0290958 A1* | 12/2007 | Cok | G09G 3/3225 | 345/77 |
| 2008/0036708 A1* | 2/2008 | Shirasaki | G09G 3/3233 | 345/76 |
| 2008/0042943 A1* | 2/2008 | Cok | G09G 3/3225 | 345/77 |
| 2008/0143653 A1* | 6/2008 | Shishido | G09G 3/3233 | 345/78 |
| 2009/0015521 A1* | 1/2009 | Fish | G09G 3/3233 | 345/76 |
| 2009/0066870 A1* | 3/2009 | Yagi | G02F 1/136204 | 349/40 |
| 2009/0315877 A1* | 12/2009 | Deane | G09G 3/3233 | 345/214 |
| 2010/0177126 A1* | 7/2010 | Inoue | H04N 5/202 | 345/690 |
| 2010/0188443 A1* | 7/2010 | Lewis | G02B 26/02 | 345/691 |
| 2010/0220118 A1* | 9/2010 | Kanegae | G09G 3/3233 | 345/690 |

OTHER PUBLICATIONS

Shin, et al., Non-Patent Literature Publication, New Fast Threshold Voltage Detecting Pixel Scheme for High Resolution and Large Area AMELOED Display, IDW 2007, p. 447-450.*

* cited by examiner

800B

METHOD OF DRIVING PIXEL ELEMENT IN ACTIVE MATRIX DISPLAY

RELATED APPLICATIONS

This application claims the benefit of U.S. Provisional Application No. 61/036,978, filed on Mar. 16, 2008.

The present application is related to the following concurrently filed and commonly owned U.S. patent application Ser. No. 12/404,326, titled “Pixel Element for Active Matrix Display”; Ser. No. 12/404,328, titled “Pixel Element for Active Matrix Display”; and Ser. No. 12/404,329, titled “Active Matrix Display Having Pixel Element with Capacitive Element.” All of these applications are hereby incorporated by reference herein in their entirety.

BACKGROUND

The present invention relates generally to active matrix displays.

FIG. 1 shows a section of an active matrix display with pixel elements including light emitting diodes. The section of an active matrix display in FIG. 1 includes a matrix of pixel elements (e.g., 100AA, 100AB, 100AC, 100BA, 100BB, 100BC, 100CA, 100CB, and 100CC), an array of column conducting lines (e.g., 200A, 200B, and 200C), an array of row conducting lines (e.g., 300A, 300B, and 300C) crossing the array of column conducting lines.

A pixel element (e.g., 100BB) in the matrix of pixel elements is electrically connected to a column conducting line (e.g., 200B) and a row conducting line (e.g., 300B). The pixel element (e.g., 100BB) includes a light emitting diode 50, a driving transistor 40, a capacitive element 30, and a switching transistor 20. The light emitting diode 50 is electrically connected to a semiconductor channel of the driving transistor 40. The capacitive element 30 has a terminal electrically connected to a gate of the driving transistor 40. The gate of the driving transistor 40 is electrically connected to a column conducting line (e.g., 200B) through a semiconductor channel of the switching transistor 20. The gate of the switching transistor 20 is electrically connected to a row conducting line (e.g., 300B).

During operation, a pixel element (e.g., 100BB) generally can be either in a charging mode or in a light-emitting mode. When the pixel element (e.g., 100BB) is in the charging mode, a selection signal (e.g., a selection voltage) on the row conducting line (e.g., 300B) drives the switching transistor 20 into a conducting state. When the switching transistor 20 is in the conducting state, a data signal (e.g., a data voltage) on a column conducting line (e.g., 200B) can set a gate voltage at the gate of the driving transistor 40 to a target voltage value. When the pixel element (e.g., 100BB) is in the light-emitting mode, a deselect signal (e.g., a deselect voltage) on the row conducting line (e.g., 300B) drives the switching transistor 20 into a non-conducting state. When the switching transistor 20 is in the non-conducting state, a gate voltage at the gate of the driving transistor 40 can be substantially maintained.

In general, a driving current passing through the light emitting diode 50 is determined by the gate voltage at the gate of the driving transistor 40. But, the driving current passing through the light emitting diode 50 also depends on some individual properties of the driving transistor 40. For example, the driving current passing through the light emitting diode 50 can depend on the threshold voltage and the carrier mobility of the driving transistor 40. The driving transistor 40 in different pixel elements may have different properties. Therefore, in certain applications, it is desirable to provide a pixel element that can compensate property variations among different pixel elements.

SUMMARY

In one aspect, a method of driving a pixel element in a matrix of pixel elements is described. The pixel element includes (1) a first capacitive element, (2) a first transistor having a semiconductor channel, a first terminal of the semiconductor channel of the first transistor being electrically connected to a first terminal of the first capacitive element, and (3) a light-emitting element operationally coupled to the first transistor such that light emitted from the light-emitting element depends upon a bias voltage of the first transistor. Here, the bias voltage is a voltage difference between the gate of the first transistor and a first terminal of the semiconductor channel of the first transistor. The method includes (1) setting the bias voltage of the first transistor to a value that is substantially close to a threshold voltage of the first transistor by changing a voltage across the first capacitive element with a current passing through the first transistor; (2) setting the bias voltage of the first transistor to a value that is different from the threshold voltage of the first transistor while substantially maintaining the voltage across the first capacitive element; and (3) detecting a portion of light emitted from the light-emitting element to cause a change of the bias voltage of the first transistor. In one implementation, the pixel element also includes a second transistor having a semiconductor channel operationally coupled to a second terminal of the semiconductor channel of the first transistor.

In another aspect, a method of driving a pixel element in a matrix of pixel elements includes (1) setting the bias voltage of a first transistor to a value that is substantially close to a threshold voltage of the first transistor by changing a voltage across a first capacitive element with a current passing through the first transistor; (2) setting the bias voltage of the first transistor to a value that is different from the threshold voltage of the first transistor; and (3) causing a change of the bias voltage of the first transistor. In one implementation, the method includes causing a change of the bias voltage of the first transistor with a current generated by a photo-detecting element. In another implementation, the method includes causing a change of the bias voltage of the first transistor with a current passing through a resistive element.

Implementations of the invention may include one or more of the following advantages. Property variations among different pixel elements may be compensated or minimized. Additional advantages of the invention will be set forth in the description which follows, and in part will be obvious from the description, or may be learned by practice of the invention. The advantages of the invention may be realized by means of the instrumentalities and combinations particularly pointed out in the claims.

BRIEF DESCRIPTION OF THE DRAWINGS

The present invention will be understood more fully from the detailed description and accompanying drawings of the invention set forth herein. However, the drawings are not to be construed as limiting the invention to the specific embodiments shown and described herein. Like reference numbers are designated in the various drawings to indicate like elements.

DETAILED DESCRIPTION

Figure 1:
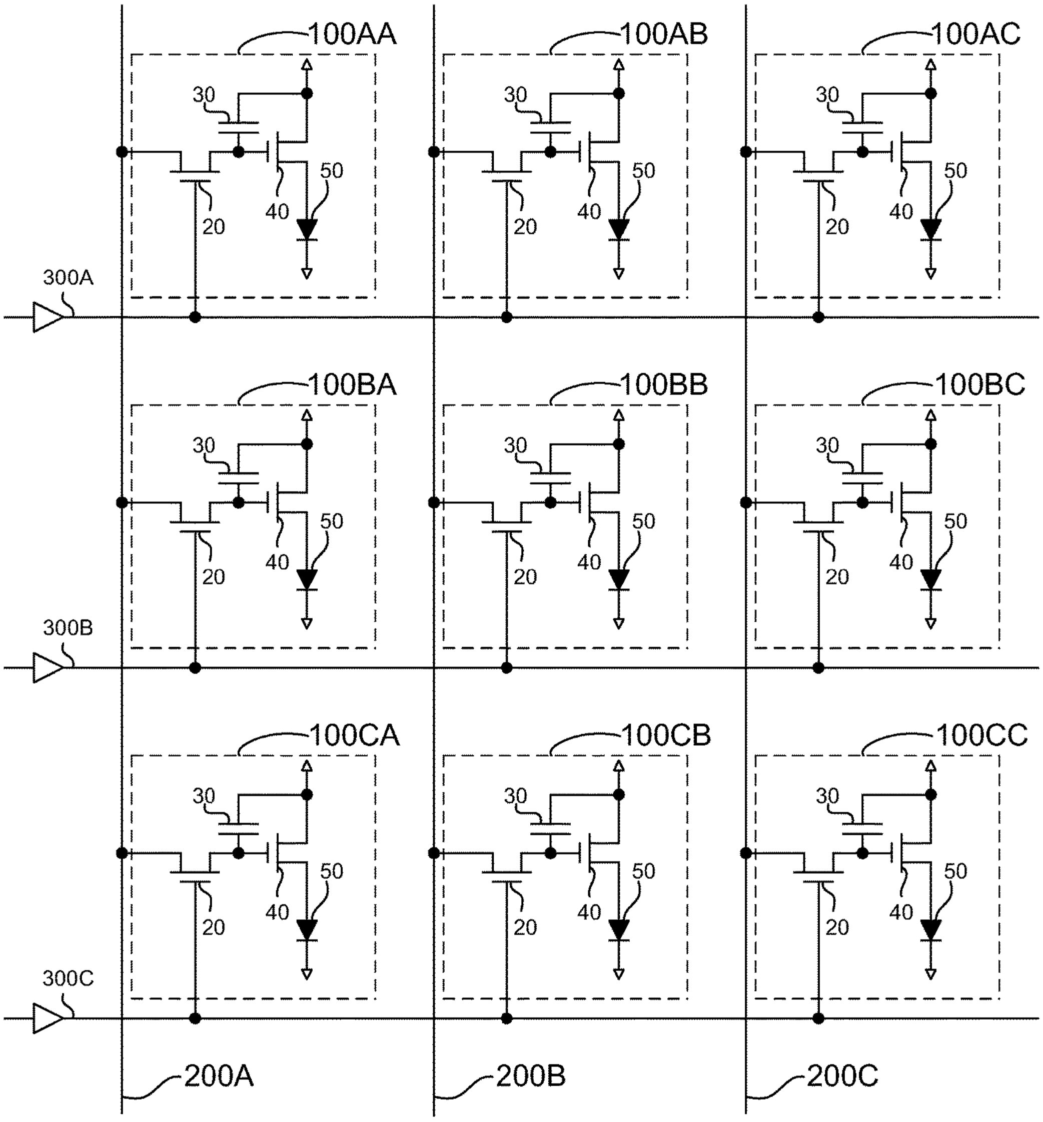
Prior Art FIG. 1
FIG. 1 shows a section of an active matrix display with pixel elements including light emitting diodes.
Figure 2:
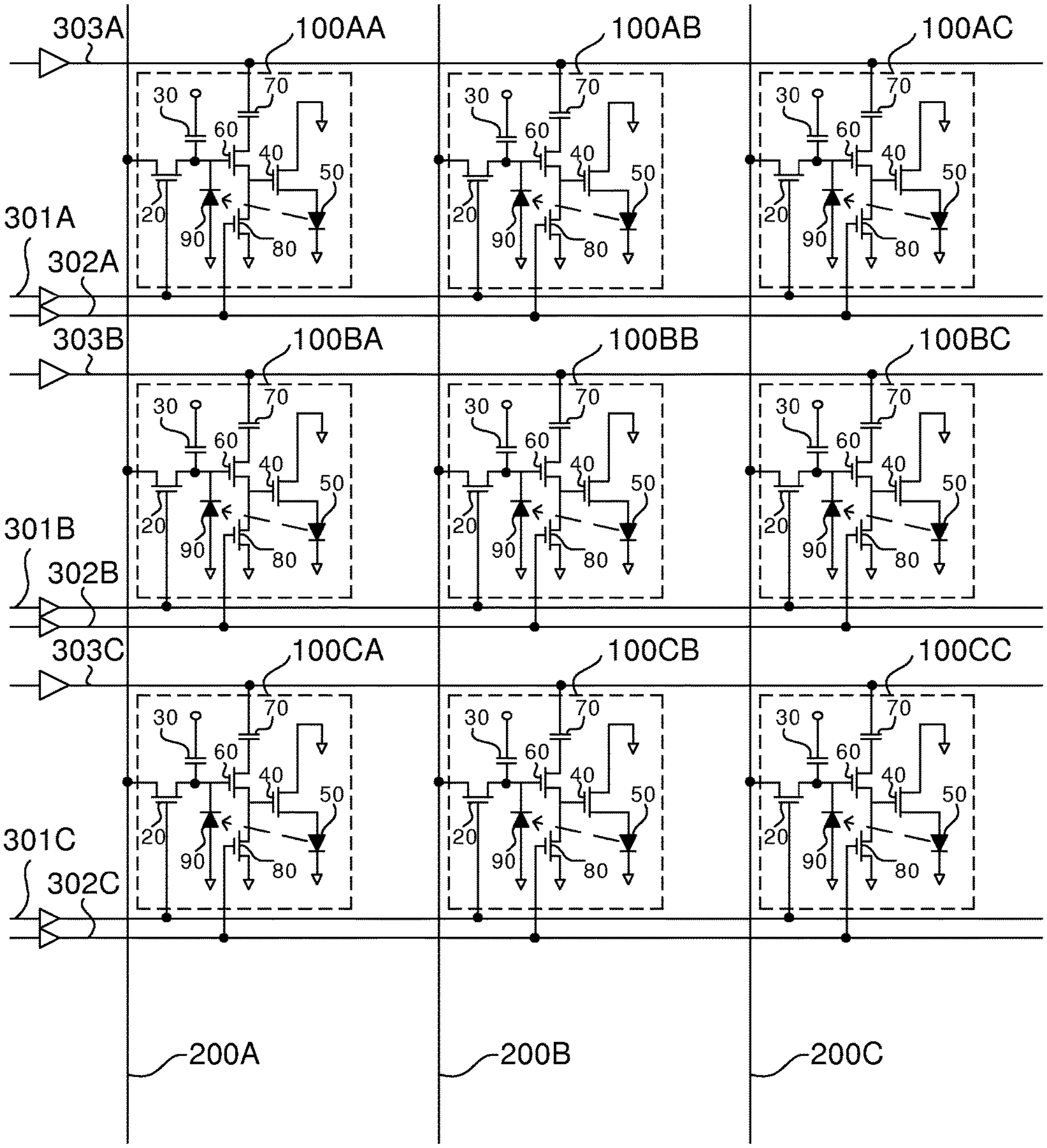
FIG. 2 shows one implementation of an active matrix display that includes a pixel element having a light-emitting element and a photo-detecting element.

FIG. 2 shows one implementation of an active matrix display that includes a pixel element having a light-emitting element and a photo-detecting element. The section of an active matrix display in FIG. 2 includes a matrix of pixel elements (e.g., 100AA, 100AB, 100AC, 100BA, 100BB, 100BC, 100CA, 100CB, and 100CC), an array of column conducting lines (e.g., 200A, 200B, and 200C), an array of row conducting lines (e.g., 301A, 302A, 303A, 301B, 302B, 303B, 301C, 302C, and 303C) crossing the array of column conducting lines.

A pixel element (e.g., 100BB) in the matrix of pixel elements is electrically connected to a column conducting line (e.g., 200B), a first row conducting line (e.g., 301B), a second row conducting line (e.g., 302B), and a third row conducting line (e.g., 303B). The pixel element (e.g., 100BB) is also shown specifically in FIG. 3A.

Figure 3A:
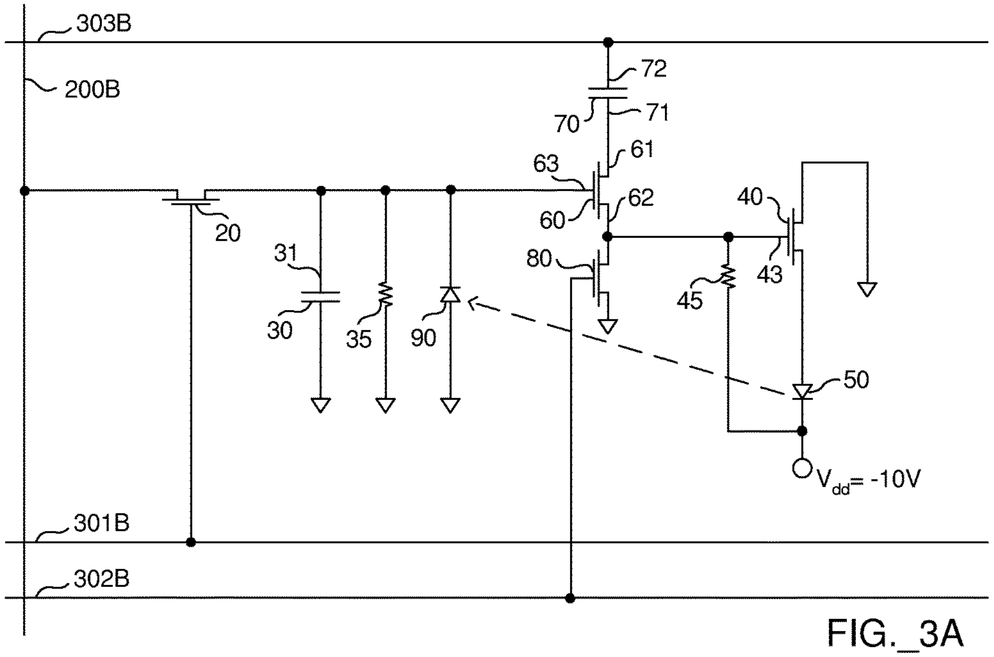
FIGS. 3A-3D illustrate implementations of a pixel element that includes at least a first capacitive element, a first transistor, a second transistor, a second capacitive element, a driving transistor, a light-emitting element, and a photo-detecting element.

In FIG. 3A, the pixel element (e.g., 100BB) includes a first capacitive element 70, a first transistor 60, a second transistor 80, a second capacitive element 30, a driving transistor 40, a light-emitting element 50, a photo-detecting element 90, and a switching transistor 20. The first transistor 60 has a semiconductor channel. The first terminal 61 of the semiconductor channel of the first transistor 60 is electrically connected to a first terminal 71 of the first capacitive element 70. The second transistor 80 has a semiconductor channel electrically connected to a second terminal 62 of the semiconductor channel of the first transistor 60. The second capacitive element 30 has a first terminal 31 electrically connected to a gate 63 of the first transistor 60. The driving transistor 40 has a gate 43 electrically connected to the second terminal 62 of the semiconductor channel of the first transistor 60. The light-emitting element 50 is electrically connected to a semiconductor channel of the driving transistor 40. The photo-detecting element 90 is electrically connected to the second capacitive element 30 and receives a portion of the light emitted from the light-emitting element 50. The switching transistor 20 has a semiconductor channel that is electrically connected between the first terminal 31 of the second capacitive element 30 and a column conducting line (e.g., 200B). The switching transistor 20 has a gate electrically connected to a first row conducting line (e.g., 301B). The second transistor 80 has a gate electrically connected to a second row conducting line (e.g., 302B). The second terminal 72 of the first capacitive element 70 is electrically connected to a third row conducting line (e.g., 303B).

During operation, a pixel element (e.g., 100BB) generally can be in threshold-setting mode, data-input mode, or optical-feedback mode. When the pixel element (e.g., 100BB) is in the threshold-setting mode, (1) a signal is applied to the second row conducting line (e.g., 302B) to drive the second transistor 80 into the low-impedance state, and (2) signals are applied to the first row conducting line (e.g., 301B) and/or the third row conducting line (e.g., 303B) to set the bias voltage of the first transistor 60 to be substantially near the threshold of the first transistor 60. In one implementation, the first transistor 60 is driven into the low-impedance state to enable the current to pass through both the semiconductor channel of the first transistor 60 and the semiconductor channel of the second transistor 80. This current will change the voltage across the first capacitive element 70 until the first transistor 60 is biased near its threshold.

When the bias voltage is changing towards the threshold, the first transistor 60 will be changing towards the high-impedance state. When the bias voltage reaches the threshold, the voltage change across the first capacitive element 70 can be essentially stopped. That is, the first capacitive element 70 will be charged or discharged until $V_{s1}-V_{g1}\approx V_{th}$, where $V_{g1}$ is the voltage at the gate of the first transistor 60, $V_{s1}$ is the voltage at the source of the first transistor 60, and $V_{th}$ is the threshold voltage of the first transistor 60. Here, the voltage $V_{s1}$ at the source of the first transistor 60 is related to the voltage $V_{ref1}$ at the second terminal 72 of the first capacitive element 70 and the voltage $V_{C1}$ across the first capacitive element: $V_{s1}=V_{ref1}-V_{C1}$. Therefore, in the threshold-setting mode, the voltage across the first capacitive element $V_{C1}$ will be charge or discharged to a value $V_{C1}\approx V_{ref1}-(V_{g1}+V_{th})$.

When the pixel element (e.g., 100BB) is in the data-input mode, signals are applied to the first row conducting line (301B) and/or the third row conducting line (303B) to drive the first transistor 60 into the high-impedance state. These signals are applied to set the bias voltage of the first transistor 60 to a value that is different from the threshold of the first transistor 60 by an offset value. Assume that the voltage across the first capacitive element is maintained at $V_{C1}$, if the voltage at the gate of the first transistor 60 is $V_{g2}$ and the voltage at the second terminal of terminal of the first capacitive element 70 is $V_{ref2}$, then, the voltage at the source of the first transistor 60 will be $V_{s2}=V_{ref2}-V_{C1}$. Consequently, the first transistor 60 will be biased at a voltage $V_{s2}-V_{g2}=V_{ref2}-V_{C1}-V_{g2}$. This bias voltage is set to be different from the threshold voltage $V_{th}$ such that $V_{s2}-V_{g2}<V_{th}$ to keep the first transistor 60 at the high-impedance state. More specifically, this bias voltage is smaller than the threshold voltage $V_{th}$ by an initial threshold offset $$V^{0}_{ffset}=V_{th}-(V_{s2}-V_{g2})=(V_{g2}-V_{g1})-(V_{ref2}-V_{ref1}).$$

Later on, this initial threshold offset $V^{0}_{offset}$ can be used to substantially determine the total amount of light emitted from the light-emitting element 50.

In one implementation, after the pixel element (e.g., 100BB) is set to the data-input mode and before light is emitted from the light-emitting element 50, both the voltage across the first capacitive element 70 and the voltage across the second capacitive element 30 are essentially maintained at constant. In one implementation as shown in FIG. 3A, the second transistor 80 is kept at the low-impedance state with a signal on the second row conducting line (e.g., 302B) to keep the driving transistor 40 at the non-conducting state to prevent light from emitted from the light-emitting element 50.

When the pixel element (e.g., 100BB) is in optical-feedback mode, the light-emitting element 50 is set to emit light. In one implementation as shown in FIG. 3A, a signal is applied to the second row conducting line (e.g., 302B) to drive the second transistor 80 into the high-impedance state. In FIG. 3A, the pull-down resistor 45 is electrically connected between the gate of the driving transistor 40 and a voltage $V_{dd}$. Under the condition that the first transistor 60 is at the high-impedance state, when the second transistor 80 is changed to the high-impedance state, the voltage at the gate of the driving transistor 40 is lowered towards $V_{dd}$ and the driving transistor 40 is driven into a conducting state. The current passing through the semiconductor channel of the driving transistor 40 will drive the light-emitting element 50 to emit light. A portion of the light emitted from the light-emitting element 50 is received by the photo-detecting element 90. The photo-induced-current $i_{ph}(t)$ generated by the photo-detecting element 90 can be proportional to $I_0(t)$, the intensity of the light emitted from the light-emitting element 50. That is, $i_{ph}(t)=kI_0(t)$, where k is a coupling coefficient.

In one implementation as shown in FIG. 3A, the photo-induced-current $i_{ph}(t)$ will cause a voltage change across the second capacitive element 30. In one implementation, the changing rate of the voltage at the gate of the first transistor 60 is proportional to the photo-induced-current current $i_{ph}(t)$. That is, $dV_g(t)/dt=-i_{ph}(t)/C_g$, where $C_g$ is the capacitance of the second capacitive element 30. The total amount of charge $Q_{ph}(t)$ deposited or removed from the second capacitive element 30 is proportional to the total amount of light $L_{total}$ emitted from the light-emitting element 50. That is, $|Q_{ph}(t)|=\int i_{ph}(t)dt=k\int I_0(t)dt=k\,L_{total}$. The total voltage change $\Delta V_g(t)=|Q_{ph}(t)|/C_g$ at the gate of the first transistor 60 will change the bias voltage $V_s-V_g$ of the first transistor. When the total voltage change $\Delta V_g(t)$ at the gate of the first transistor 60 exceeds the initial threshold offset $V^{0}_{offset}$, the first transistor 60 will change from the high-impedance state to the low-impedance state. The current passing through the semiconductor channel of the first transistor 60 will cause a voltage change across the pull-down resistor 45 and cause a voltage increase at the gate of the driving transistor 40. When the driving transistor 40 is driven into non-conducting state, light emission from the light-emitting element 50 will be stopped. Consequently, the total amount of light $L_{total}$ emitted from the light-emitting element 50 is directly related to the initial threshold offset $V^{0}_{offset}$. That is, $L_{total}=(C_g/k)V^{0}_{offset}$.

In operation, pixel elements in the active matrix display of FIG. 2 can be driven in the following manner. A row of pixel elements (e.g., 100AA, 100AB, and 100AC) is selected and the other rows of elements (e.g., the row of pixel elements 100BB, 100BB, and 100BC, and the row of pixel elements 100CB, 100CB, and 100CC) are kept at optical-feedback mode. Each of the selected pixel elements (e.g., 100AA, 100AB, or 100AC) is first set to threshold-setting mode, and then set to data-input mode for setting the bias voltage of the first transistor 60 at a voltage that is offset from the threshold voltage $V_{th}$ by a corresponding initial threshold offset $V^{0}_{offset}$. The total amount of light emitted from each light-emitting element can be substantially determined by the corresponding initial threshold offset $V^{0}_{offset}$. Finally, each of the selected pixel elements (e.g., 100AA, 100AB, or 100AC) is set to optical-feedback mode.

In operation, after one row of pixel elements (e.g., 100AA, 100AB, and 100AC) is selected, the next row of pixel elements (e.g., 100BA, 100BB, and 100BC) is selected and the other rows of elements (e.g., the row of pixel elements 100AB, 100AB, and 100AC, and the row of pixel elements 100CB, 100CB, and 100CC) are kept at optical-feedback mod. In this manner, each row of pixel elements in the matrix is selected sequentially. After the last row of pixel elements in the matrix is selected, a complete frame of image can be formed.

In one implementation as shown in FIG. 3A, the pixel element (e.g., 100BB) may include a resistor 35 with a terminal connected to the gate of the first transistor 60. During optical-feedback mode, the resistor 35 may pull down the voltage at the gate of the first transistor 60 to ensure the first transistor 60 be kept at the low-impedance state after light emission from the light-emitting element 50 is stopped. In some implementations, when a reverse-biased photo-diode is used as the photo-detecting element 90, the leakage resistance of the reverse-biased photo-diode can possibly be used as the resistor 35. In another implementation, a slow-voltage-ramp can be applied to the second terminal of the first capacitive element 70 with the third row conducting line (e.g., 303B) to ensure the first transistor 60 be kept at the low-impedance state after light emission from the light-emitting element 50 is stopped. For example, the voltage $V_{ref}(t)$ at the second terminal of the first capacitive element 70 can take the form $V_{ref}(t)=V_{ref2}+\alpha t$, where $\alpha$ is a small positive number. In above implementations, the current passing through the resistor 35 or the change of voltage $V_{ref}(t)$ due to the slow-voltage-ramp can cause some deviations in the relationship between $L_{total}$ and $V^0_{offset}$ That is, in these circumstances, the equation $L_{total}=(C_g/k)\ V^0_{offset}$ may need to include some corrections. In addition, in some implementations, a resistor 75 (not shown in FIG. 3A) with a terminal connecting to the source of the first transistor 60 may be used as a replacement for the resistor 35. The resistor 75 may pull up the voltage at the source of the first transistor 60 to ensuring the first transistor 60 be kept at the low-impedance state after light emission from the light-emitting element 50 is stopped.

In some implementations, when the pixel element (e.g., 100BB) in FIG. 3A is in the threshold-setting mode, before the voltage $V_{g1}$ is applied to the gate of the first transistor 60 and the voltage $V_{ref1}$ is applied to the second terminal of the first capacitive element 70, it maybe necessary to drive the first transistor 60 into the conduction-state with another voltage $V_{g0}$ applied to the gate of the first transistor 60 and/or another voltage $V_{ref0}$ applied to the second terminal of the first capacitive element 70. Voltages $V_{g0}$ and $V_{ref0}$ can be selected to ensure the first transistor 60 be driven into the conduction-state irrespective the value of the voltage $V_{C0}$ across the first capacitive element 70 just before the pixel element (e.g., 100BB) is changed into threshold-setting mode.

Figure 3B:
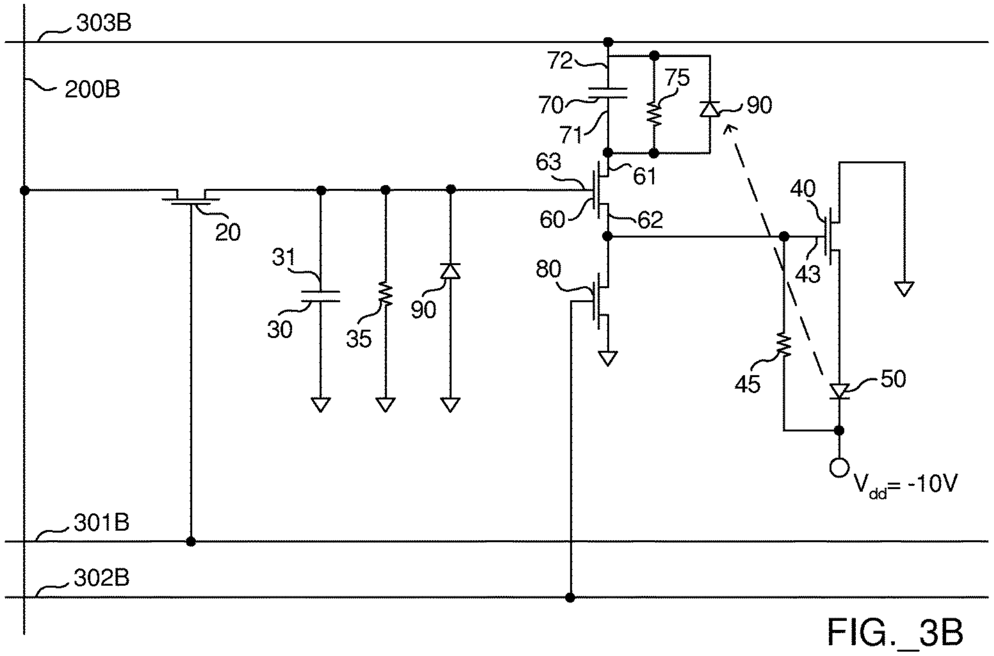

FIG. 3B shows another implementation of the pixel element (e.g., 100BB). The pixel element (e.g., 100BB) in FIG. 3B is similar to the pixel element (e.g., 100BB) in FIG. 3A, except that the photo-detecting element 90 in FIG. 3B is electrically connected to the first capacitive element 70, whereas the photo-detecting element 90 in FIG. 3A is electrically connected to the second capacitive element 30. When the pixel element (e.g., 100BB) is in optical-feedback mode, a portion of the light emitted from the light-emitting element 50 is received by the photo-detecting element 90. The photo-induced-current $i_p(t)$ generated by the photo-detecting element 90 will cause a voltage change across the first capacitive element 70. That is, $dV_C(t)/dt=-i_{ph}(t)/C_s$, where $V_C(t)$ is the voltage across the first capacitive element 70 and $C_s$ is the capacitance of the first capacitive element 70. It can be shown that when the total voltage change across the first capacitive element $\Delta V_C(t))=\int i_{ph}(t)/C_s$ exceeds the initial threshold offset $V^0_{offset}$, the first transistor 60 will change from the high-impedance state to the low-impedance state and the driving transistor 40 will be driven into the non-conducting state. It can also be shown that the total amount of light $L_{total}$ emitted from the light-emitting element 50 is directly related to the initial threshold offset $V^0_{offset}$. More specifically, $L_{total}=(C_s/k)V^0_{offset}$, where k is a coupling coefficient between the photo-detecting element 90 and the light-emitting element 50.

In addition, in some implementations, the pixel element (e.g., 100BB) may include a resistor 35 with a terminal connected to the gate of the first transistor 60 to ensure the first transistor 60 be kept at the low-impedance state after light emission from the light-emitting element 50 is stopped. In some implementations, the pixel element (e.g., 100BB) may include a resistor 75 with a terminal connecting to the source of the first transistor 60 to ensure the first transistor 60 be kept at the low-impedance state after light emission from the light-emitting element 50 is stopped. In still some implementations, the pixel element (e.g., 100BB) may include both a resistor 35 and a resistor 75.

Figure 3C:
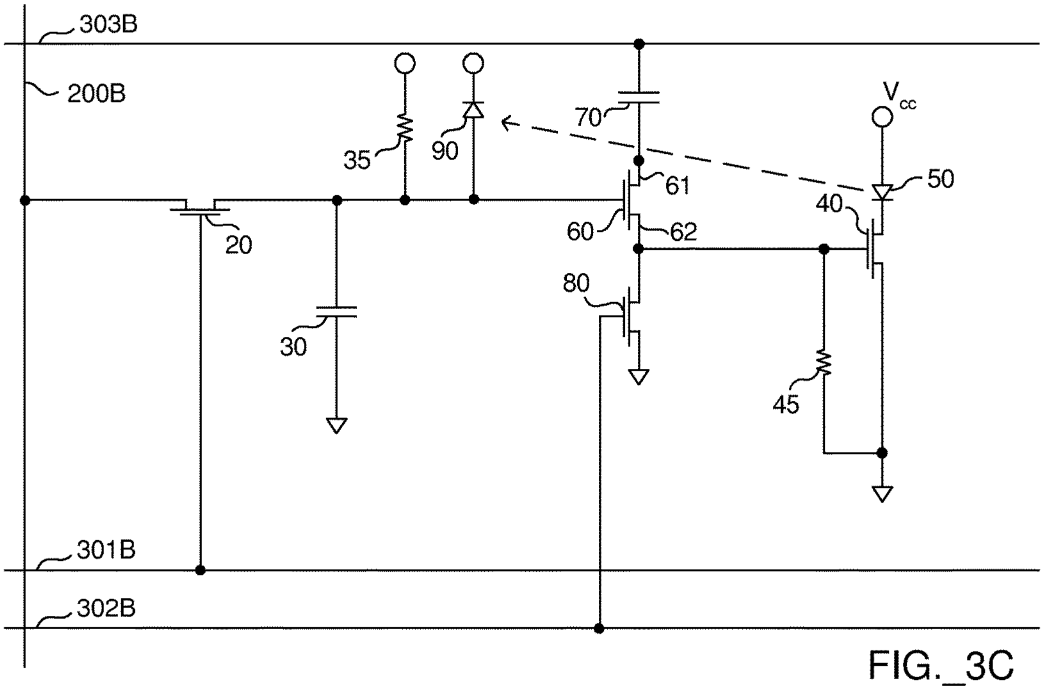

FIG. 3C shows another implementation of the pixel element (e.g., 100BB) in which the driving transistor 40 is a NFET. Like the pixel element in FIG. 3A, the pixel element in FIG. 3C generally can also be in threshold-setting mode, data-input mode, or optical-feedback mode. While in threshold-setting mode, the pixel element in FIG. 3C operates similarly as the pixel element in FIG. 3A. At the end of the threshold-setting mode, the voltage across the first capacitive element $V_{C1}$ will be change to a value $V_{C1}\approx V_{ref1}-(V_{g1}+V_{th})$, where $V_{g1}$ is the voltage at the gate of the first transistor 60 and $V_{ref1}$ is the voltage at the second terminal of terminal of the first capacitive element 70.

In data-input mode and optical-feedback mode, however, the pixel element in FIG. 3C operates somewhat differently from the pixel element in FIG. 3A. When the pixel element in FIG. 3C is in data-input mode, the second transistor 80 is first driven into the high-impedance state with a signal on the second row conducting line 302B, and then, the first transistor 60 is driven into the low-impedance state with signals applied to the first row conducting line (301B) and/or the third row conducting line (303B). These signals are applied to set the bias voltage of the first transistor 60 to a value that is different from the threshold of the first transistor 60 by an offset value. Assume that the voltage across the first capacitive element is maintained at $V_{C1}$, if the voltage at the gate of the first transistor 60 is $V_{g2}$, the voltage at the second terminal of terminal of the first capacitive element 70 is $V_{ref2}$, then, the first transistor 60 will be biased at a voltage $V_{s2}-V_{g2}=V_{ref2}-V_{C1}-V_{g2}$. This bias voltage is set to be different from the threshold voltage $V_{th}$ such that $V_{s2}-V_{g2}>V_{th}$ to keep the first transistor 60 at the low-impedance state. More specifically, this bias voltage is larger than the threshold voltage $V_{th}$ by an initial threshold offset $$V^0_{offset}=(V_{s2}-V_{g2})-V_{th}=(V_{ref2}-V_{ref1})-(V_{g2}-V_{g1}).$$

When the pixel element in FIG. 3C is in optical-feedback mode, the photo-induced-current current $i_{ph}(t)$ generated by the photo-detecting element 90 will cause a voltage change at the gate of the first capacitive element 70. That is, $dV_g(t)/dt=i_{ph}(t)/C_g$, where $C_g$ is the capacitance of the second capacitive element 30. It can be shown that when the total voltage change $\Delta V_g(t))=\int i_{ph}(t)/C_g$ at the gate of the first capacitive element 70 exceeds the initial threshold offset $V^0_{offset}$, the first transistor 60 will change from the low-impedance state to the high-impedance state and the driving transistor 40 will be driven into the non-conducting state. It can also be shown that the total amount of light $L_{total}$ emitted from the light-emitting element 50 is directly related to the initial threshold offset $V^0_{offset}$. More specifically, $L_{total}=(C_g/k)V^0_{offset}$, where k is a coupling coefficient between the photo-detecting element 90 and the light-emitting element 50.

Figure 3D:
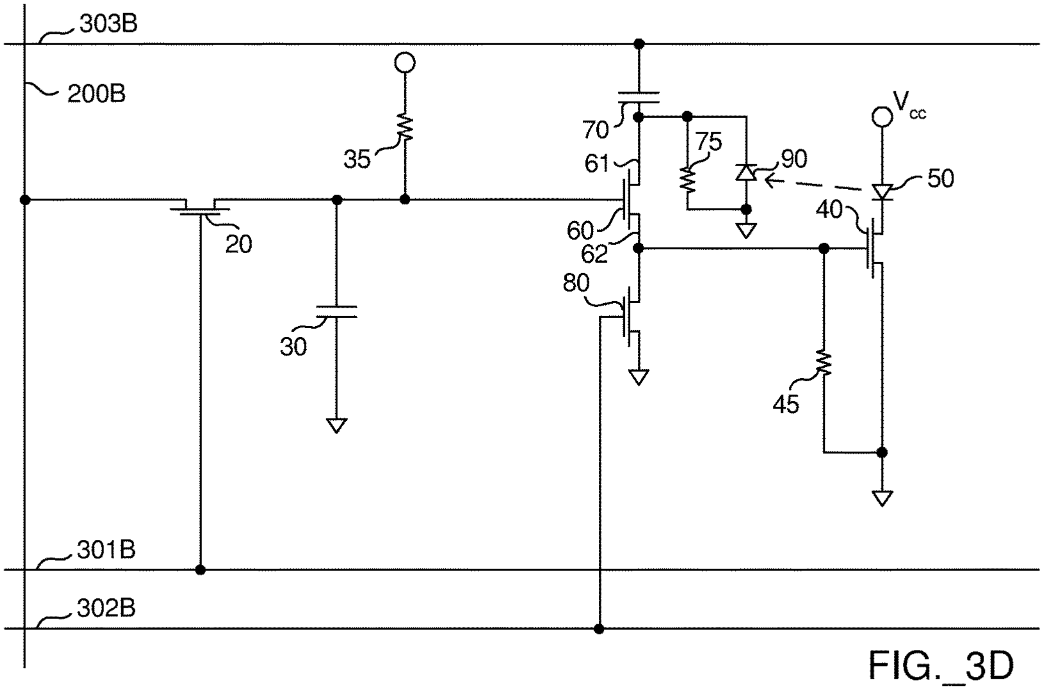

FIG. 3D shows another implementation of the pixel element (e.g., 100BB) in which the driving transistor 40 is a NFET. The pixel element (e.g., 100BB) in FIG. 3D is similar to the pixel element (e.g., 100BB) in FIG. 3C, except that the photo-detecting element 90 in FIG. 3D is electrically connected to the first capacitive element 70. During data-input mode, the bias voltage of the first transistor 60 is set to a value that is different from the threshold voltage $V_{th}$ by an initial threshold offset $V^0_{offset}$. During optical-feedback mode, the photo-induced-current generated by the photo-detecting element will cause a voltage change across the first capacitive element 70, and the light-emitting element 50 will emit light until the total voltage change across the first capacitive element 70 exceeds the initial threshold offset $V^0_{offset}$. It can also be shown that the total amount of light $L_{total}$ emitted from the light-emitting element 50 is directly related to the initial threshold offset $V^0_{offset}$. More specifically, $L_{total}=(C_s/k)V^0_{offset}$, where k is a coupling coefficient between the photo-detecting element 90 and the light-emitting element 50, and $C_s$ is the capacitance of the first capacitive element 70.

Figure 4A:
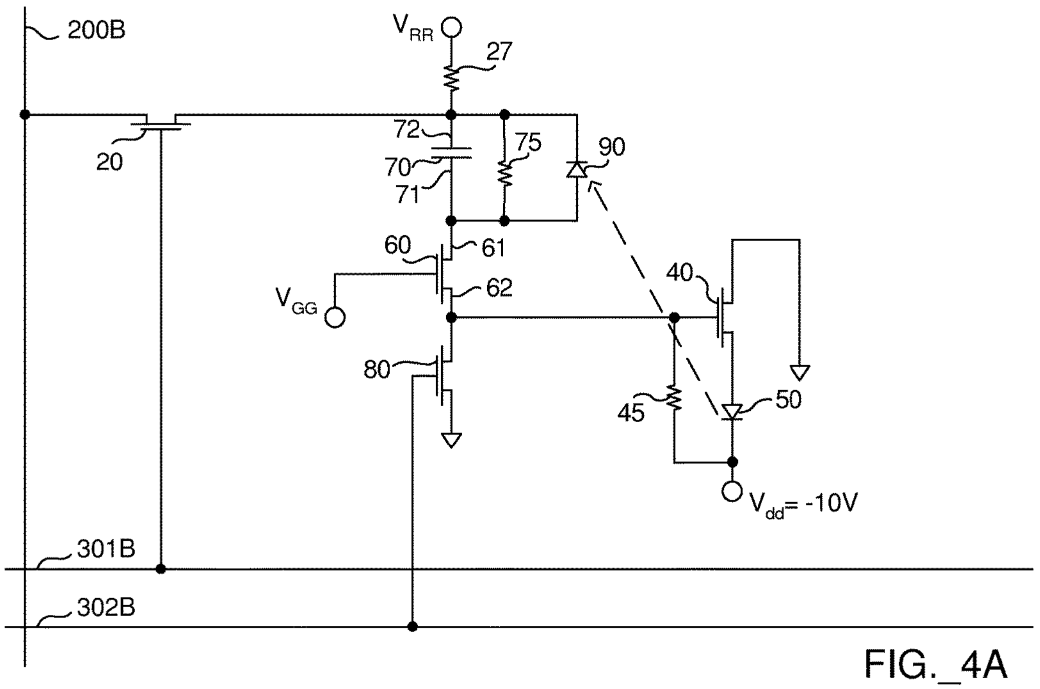
FIGS. 4A-4B illustrate implementations of a pixel element in which the second terminal of the first capacitive element is electrically connected to a column conducting line through the switching transistor.
Figure 4B:
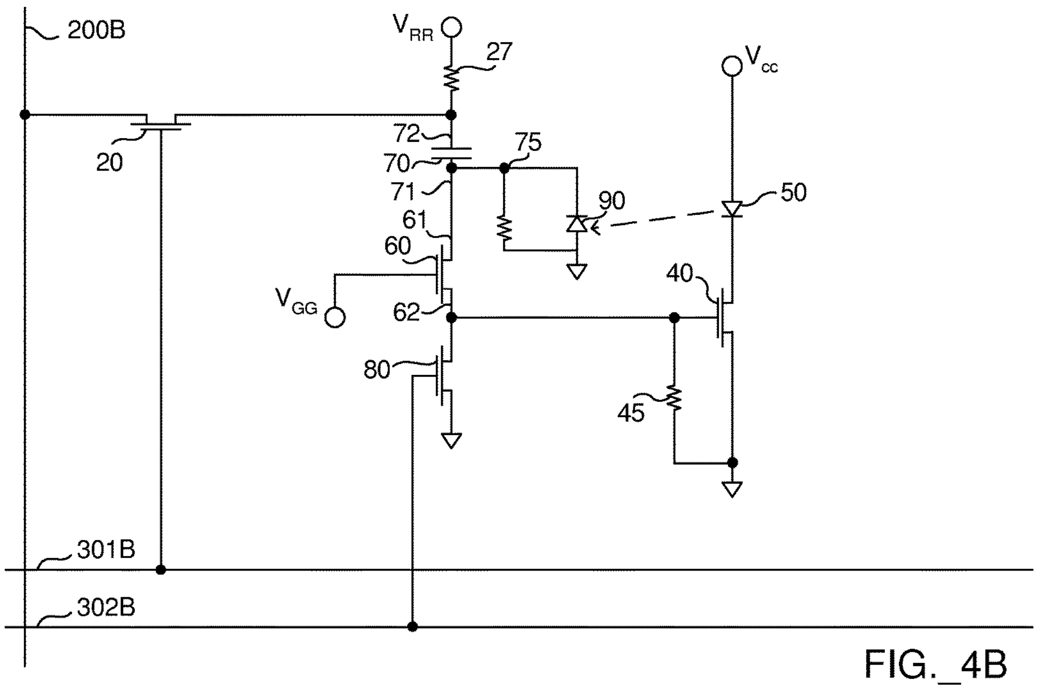

FIGS. 4A-4B illustrate another implementation of the pixel element (e.g., 100BB) in which the second terminal 72 of the first capacitive element 70 is electrically connected to a column conducting line (e.g., 200B) through the switching transistor 20. The second terminal 72 of the first capacitive element 70 is electrically connected to a common reference voltage $V_{RR}$ through a resistive element 27. The gate of the first transistor 60 is connected to a gate reference voltage $V_{GG}$. In threshold-setting mode and data-input mode, signals on the column conducting line (e.g., 200B) are applied to the second terminal 72 of the first capacitive element 70 through the switching transistor 20, and the bias voltage of the first transistor 60 is set to be different from the threshold voltage $V_{th}$ by an initial threshold offset $V^0_{offset}$. In optical-feedback mode, the switching transistor 20 is driven into non-conducting state with a signal applied on the first row conducting line 301B, and the second terminal of the first capacitive element 70 is isolated from the column conducting line 200B. During optical-feedback mode, the current generated by the photo-detecting element will cause a voltage change across the first capacitive element 70, and the light-emitting element 50 will emit light until the total voltage change across the first capacitive element 70 exceeds the initial threshold offset $V^0_{offset}$.

Figure 5A:
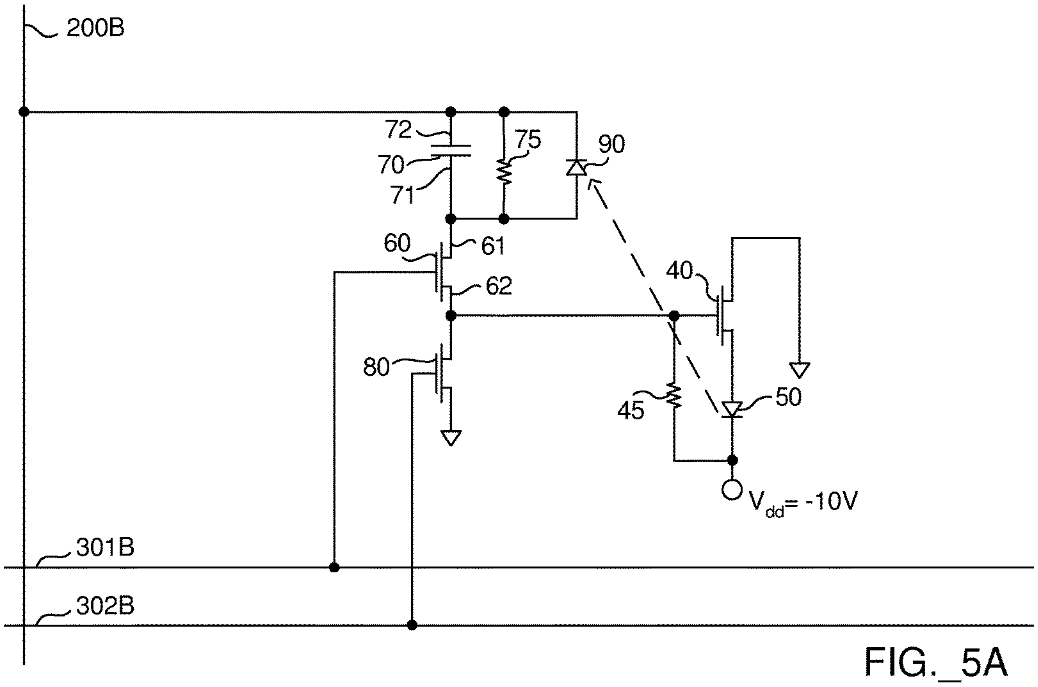
FIG. 5A shows another implementation of a pixel element in which the second terminal of the first capacitive element is electrically connected to a column conducting line directly.

FIG. 5A shows another implementation of the pixel element (e.g., 100BB) in which the second terminal 72 of the first capacitive element 70 is electrically connected to a column conducting line (e.g., 200B) directly. The gate of the first transistor 60 is connected to the first row conducting line (e.g., 301B). The gate of the second transistor 80 is connected to the second row conducting line (e.g., 302B). The pixel element (e.g., 100BB) generally can be in threshold-setting mode, data-input mode, standby mode, or optical-feedback mode.

When the pixel element (e.g., 100BB) is in threshold-setting mode, data-input mode, or standby mode, the second transistor 80 is drive to the low-impedance state with a signal applied to the second row conducting line 302B. When the pixel element (e.g., 100BB) is in optical-feedback mode, the second transistor 80 is drive to the high-impedance state with a signal applied to the second row conducting line 302B.

In threshold-setting mode, voltage $V_{g1}$ is applied to the gate of the first transistor 60 and voltage $V_{ref1}$ is applied to the second terminal 72 of the first capacitive element 70 to set the bias voltage of the first transistor 60 to be substantially near its threshold. In threshold-setting mode, the voltage across the first capacitive element $V_{C1}$ will be changed to a value $V_{C1}\approx V_{ref1}-(V_{g1}+V_{th})$. Certainly, before voltage $V_{g1}$ and voltage $V_{ref1}$ are applied to the pixel element (e.g., 100BB), other voltages can be applied to the pixel element to ensure that the first transistor 60 is at the low-impedance state when voltage $V_{g1}$ and voltage $V_{ref1}$ are applied.

In standby mode, a voltage $V_{g\_OFF}$ is applied to the gate of the first transistor 60 to drive the first transistor 60 into the high-impedance state. During standby mode, there is no light emitted from the light-emitting element 50, and the voltage across the first capacitive element $V_{C1}$ will be maintained. The voltage $V_{g\_OFF}$ is selected to keep the first transistor 60 at the high-impedance state even if the voltage applied to the second terminal 72 of the first capacitive element 70 are constantly changing to different values at different time because of a column conducting line (e.g., 200B).

In data-input mode, voltage $V_{GG}$ is applied to the gate of the first transistor 60 and voltage $V_{REF}$ is applied to the second terminal 72 of the first capacitive element 70 to keep the first transistor 60 at the high-impedance state and to set the bias voltage the first transistor 60 differ from the threshold voltage $V_{th}$ by an initial threshold offset $V^0_{offset}=(V_{GG}-V_{g1})-(V_{REF}-V_{ref1})$.

In optical-feedback mode, the second transistor 80 is drive to the high-impedance state and the driving transistor 40 is driven into to the conducting state. During optical-feedback mode, the photo-current generated by the photo-detecting element will cause a voltage change across the first capacitive element 70, and the light-emitting element 50 will emit light until the total voltage change across the first capacitive element 70 exceeds the initial threshold offset $V^0_{offset}$.

Figure 5B:
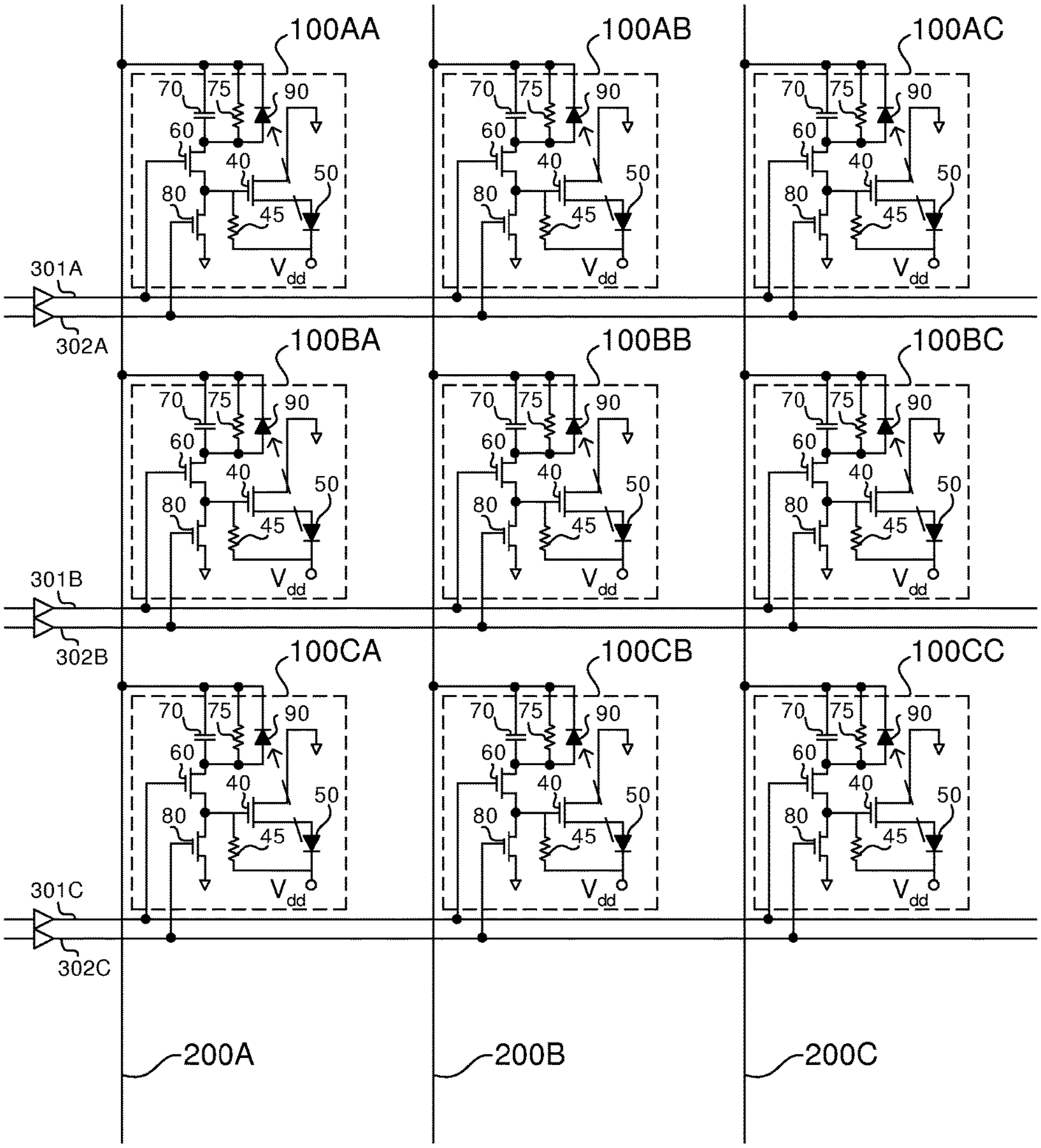
FIG. 5B shows one implementation of an active matrix display in which the pixel element of FIG. 5A is used as the pixel element in the matrix.

FIG. 5B shows one implementation of an active matrix display in which the pixel element of FIG. 5A is used as the pixel element in the matrix. In FIG. 5B, a pixel element (e.g., 100BB) in the matrix of pixel elements is electrically connected to a column conducting line (e.g., 200B), a first row conducting line (e.g., 301B), and a second row conducting line (e.g., 302B).

In operation, pixel elements in the active matrix display of FIG. 5B can be driven in the following manner. At time $T_1$, a row of pixel elements (e.g., 100AA, 100AB, and 100AC) is selected to set to threshold-setting mode. Voltage $V_{g1}$(A) is applied to the first row conducting line 301A connecting to this selected row. Voltages $V_{ref1}$(AA), $V_{ref1}$(AB), and $V_{ref1}$(AC) are respectively applied to the column conducting line 200A, 200B, and 200C. In addition, the other rows of elements (e.g., the row of pixel elements 100BA, 100BB, and 100BC, or the row of pixel elements 100CA, 100CB, and 100CC) are set to standby mode with voltage $V_{g\_OFF}$ are applied to the corresponding first row conducting line (e.g., 301B, or 301C).

At time $T_2$, another row of pixel elements (e.g., 100BA, 100BB, and 100BC) is selected to set to threshold-setting mode. Voltage $V_{g1}$(B) is applied to the first row conducting line 301A connecting to this selected row. Voltages $V_{ref1}$(BA), $V_{ref1}$(BB), and $V_{ref1}$(BC) are respectively applied to the column conducting line 200A, 200B, and 200C. In addition, the other rows of elements (e.g., the row of pixel elements 100AA, 100AB, and 100AC, or the row of pixel elements 100CA, 100CB, and 100CC) are set to standby mode with voltage $V_{g\_OFF}$ are applied to the corresponding first row conducting line (e.g., 301A, or 301C).

At time $T_3$, the next row of pixel elements (e.g., 100CA, 100CB, and 100CC) is selected to set to threshold-setting mode. Voltage $V_{g1}$(C) is applied to the first row conducting line 301A connecting to this selected row. Voltages $V_{ref1}$(CA), $V_{ref1}$(CB), and $V_{ref1}$(CC) are respectively applied to the column conducting line 200A, 200B, and 200C. In addition, the other rows of elements (e.g., the row of pixel elements 100AA, 100AB, and 100AC, or the row of pixel elements 100BA, 100BB, and 100BC) are set to standby mode with voltage $V_{g\_OFF}$ are applied to the corresponding first row conducting line (e.g., 301A, or 301B).

At time $T_4$, pixel elements in all rows are set to data-input mode with (1) a voltage $V_{GG}$ applied to the first row conducting line connecting to each of these rows (i.e., 301A, 301B, and 301C), and (2) a voltage $V_{REF}$ applied to the column conducting line connecting to each of column of pixel elements (i.e., 200A, 200B, and 200C).

At time $T_5$, pixel elements in all rows are set to optical-feedback mode with a signal applied to the second row conducting line in each row (i.e., 302A, 302B, and 302C) to drive the second transistor 80 to the high-impedance state and to initiate the light emitting process for the light-emitting element 50 in each of these pixel elements. In this manner, a complete frame of image can be formed. The total amount of light $L_{total}$ emitted from the light-emitting element 50 in each pixel element (e.g., 100AB) is directly related to the initial threshold offset $V^0_{off}$, in each pixel element (e.g., 100AB). As examples, for pixel element 100AB, the total amount of light emitted $L_{total}(AB)=(C_s/k) V^0_{offset}(AB)$, where k is a coupling coefficient between the photo-detecting element 90 and the light-emitting element 50 in pixel element 100AB, and $C_s$ is the capacitance of the first capacitive element 70. In addition, the initial threshold offset $V^0_{offset}$ can be determined by the following equations, $$V^0_{offset}(AB)=V_{GG}-V_{g1}(A)-V_{REF}+V_{ref1}(AB).$$

FIGS. 6A-6D and FIGS. 7A-7D illustrate some implementations of the pixel element (e.g., 100BB) in general. The pixel element (e.g., 100BB) having multiple operation modes includes a first capacitive element 70, a first transistor 60, and a light-emitting element 50. The first transistor 60 has a semiconductor channel. The first terminal 61 of the semiconductor channel of the first transistor 60 is electrically connected to a first terminal 71 of the first capacitive element 70. The light-emitting element 50 is operationally coupled to the first transistor 60 such that light emitted from the light-emitting element 50 depends upon a voltage difference between the gate 63 of the first transistor and a first terminal 61 of the semiconductor channel of the first transistor 60 at least during one operation mode.

In FIGS. 6A-6B and FIGS. 7A-7B, the pixel element also includes a second capacitive element 30 having a first terminal 31 electrically connected to a gate 63 of the first transistor 60. The second terminal 32 of the second capacitive element 30 can be connected to a voltage $V_{CP}$. In some implementations, the voltage $V_{CP}$ can be set to be identical to a common voltage, such as, the power voltage, the ground voltage, or other common voltage.

In one implementation, the pixel element includes a pixel sub-circuit 150. The pixel sub-circuit 150 has an input 151 electrically connected to the second terminal 62 of the semiconductor channel of the first transistor 60. Light emitted from the light-emitting element 50 in the pixel sub-circuit 150 depends upon a signal at the input of the pixel sub-circuit. In some implementations, the pixel sub-circuit 150 can have more than one input.

In the implementation as shown in FIGS. 6A-6D, the pixel element includes a second transistor 80. The second transistor 80 having a semiconductor channel operationally coupled to the second terminal 62 of the semiconductor channel of the first transistor 60.

In the implementation as shown in FIGS. 7A-7D, the pixel element includes a multi-mode electrical circuit 180. The multi-mode electrical circuit 180 has at least one mode input 185 operable to set the multi-mode electrical circuit 180 into a first mode and a second mode. The multi-mode electrical circuit is operationally coupled to a second terminal 62 of the semiconductor channel of the first transistor 60. In the first mode, the multi-mode electrical circuit 185 enables current flow into or flow from the second terminal 62 of the semiconductor channel of the first transistor 60. In the second mode, the multi-mode electrical circuit 185 substantially prevents current flow into or flow from the second terminal 62 of the semiconductor channel of the first transistor 60.

In general, the pixel element can include a photo-detecting element configured to couple the first capacitive element 70 operationally with the light-emitting element 50 such that a portion of the light emitted from the light-emitting element 50 induces a voltage change across the first capacitive element 70. In the implementation as shown in FIGS. 6B-6D and FIGS. 7B-7D, the pixel element includes a photo-detecting element 90; the photo-detecting element 90 is electrically connected to the first capacitive element 70 and receives a portion of the light emitted from the light-emitting element 50.

Figure 6A:
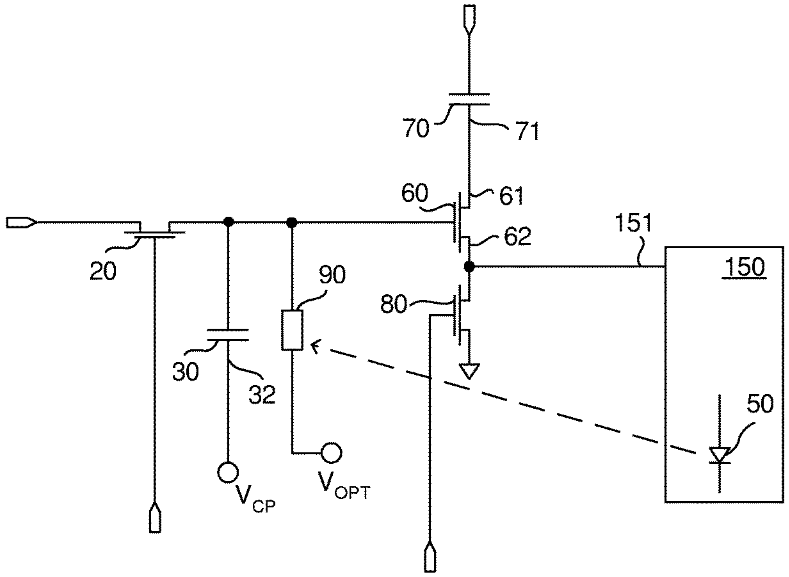
FIGS. 6A-6D illustrate some implementations of a pixel element that includes at least a first capacitive element, a first transistor, a second transistor, a pixel sub-circuit having a light-emitting element, and a photo-detecting element.
Figure 6B:
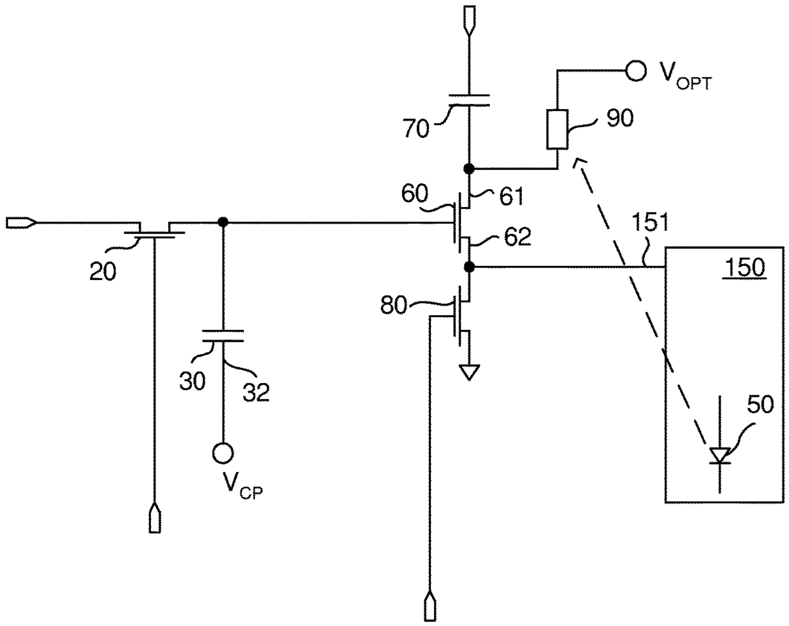
Figure 7A:
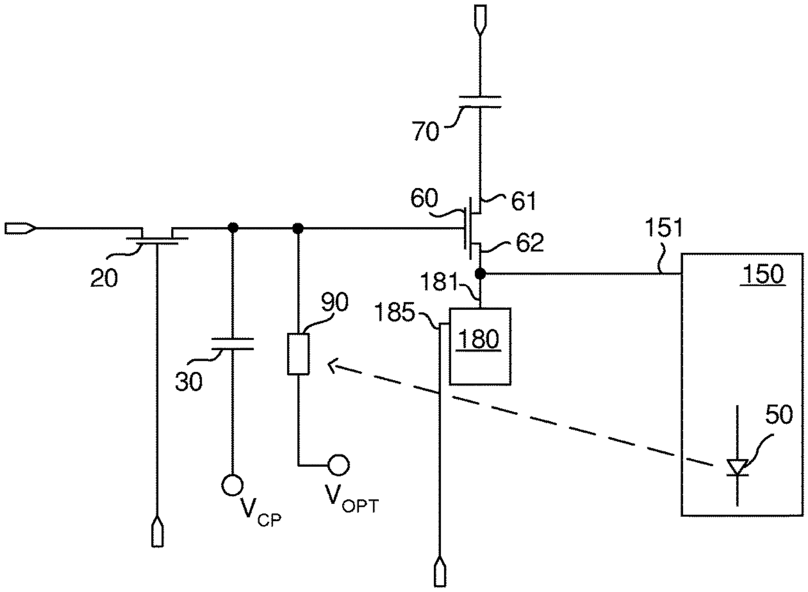
FIGS. 7A-7D illustrate some implementations of a pixel element that includes at least a first capacitive element, a first transistor, a multi-mode electrical circuit, a pixel sub-circuit having a light-emitting element, and a photo-detecting element.
Figure 7B:
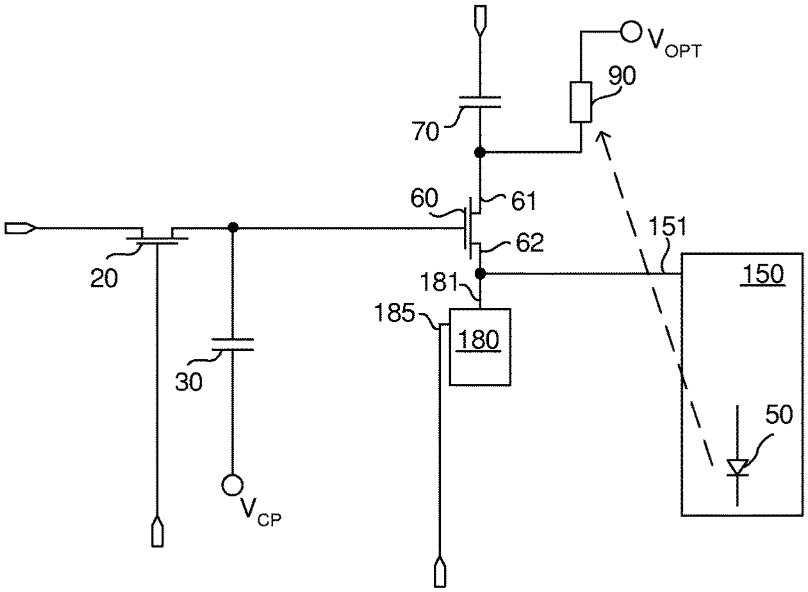

In general, the pixel element can include a photo-detecting element configured to couple the second capacitive element 30 operationally with the light-emitting element 50 such that a portion of the light emitted from the light-emitting element 50 induces a voltage change across the second capacitive element 30. In the implementation as shown in FIG. 6A and FIG. 7A, the photo-detecting element 90 is electrically connected to the second capacitive element 30 and receives a portion of the light emitted from the light-emitting element 50.

In FIG. 6A-6D and FIG. 7A-7D, the photo-detecting element 90 can be a photo-diode, photo-conductor, phototransistor, or other kinds of optical detectors. The photo-detecting element 90 can be biased with a bias voltage $V_{opt}$. In some implementations, the bias voltage $V_{opt}$ can be set to be identical to a common voltage, such as, the power voltage, or the ground voltage, or other common voltage.

Figure 6C:
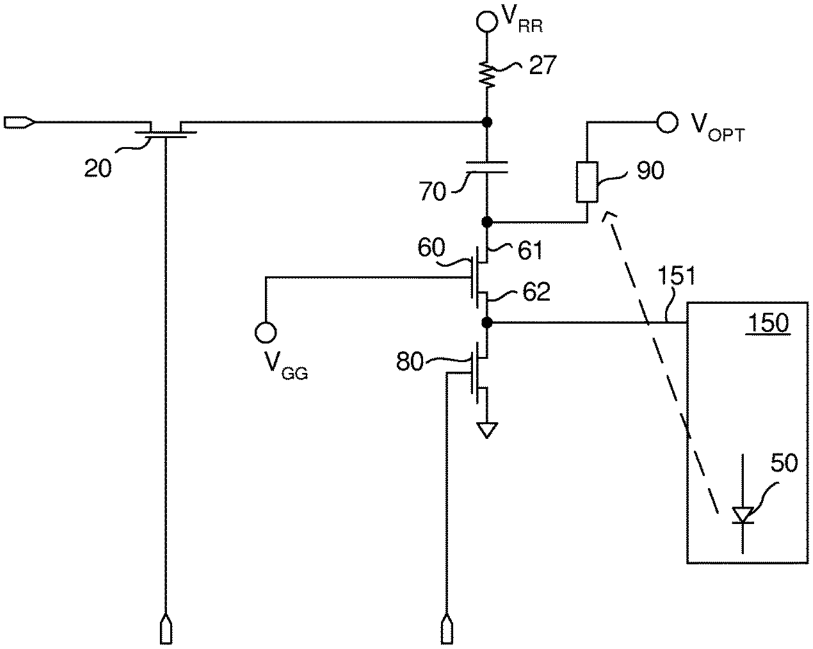
Figure 6D:
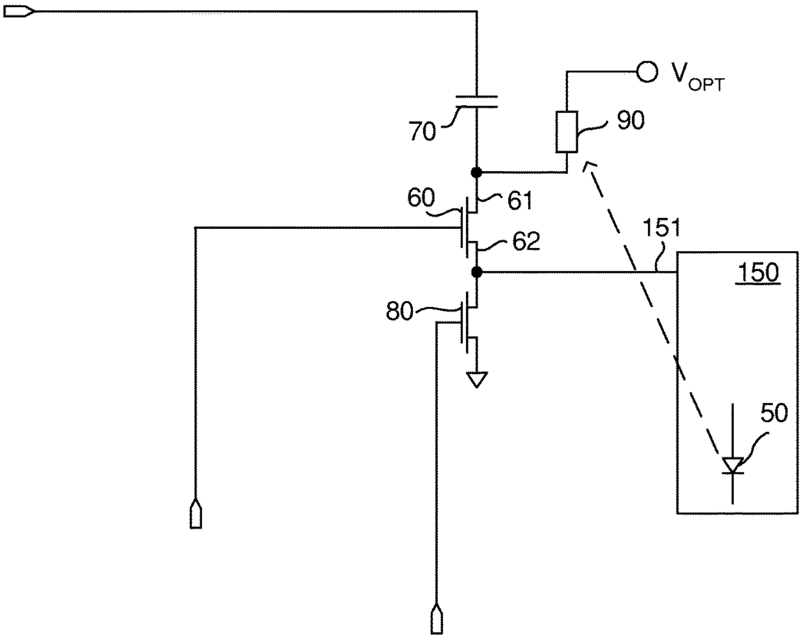
Figure 7C:
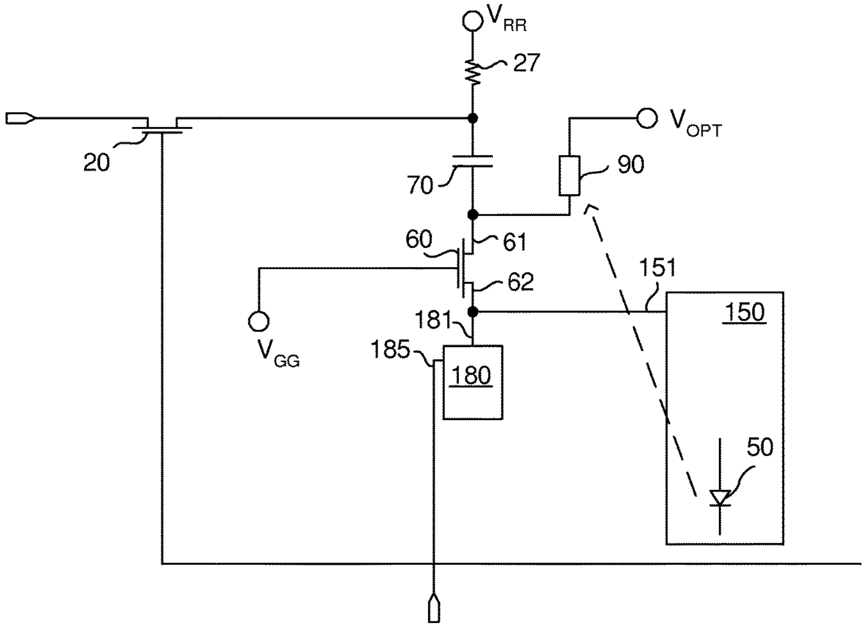
Figure 7D:
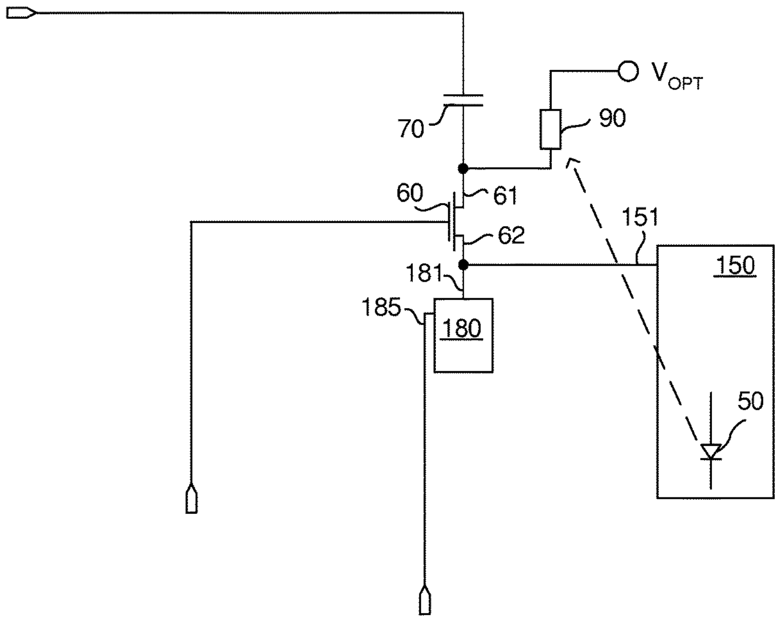

In the implementation as shown in FIGS. 6A-6B and FIGS. 7A-7B, the pixel element includes a switching transistor 20 having a semiconductor channel electrically connecting to a first terminal 31 of the second capacitive element 30. In the implementation as shown in FIG. 6C and FIG. 7C, the pixel element includes a switching transistor 20 having a semiconductor channel electrically connecting to a second terminal 72 of the first capacitive element 70. The pixel element also includes a resistive element 27 having a first terminal electrically connecting to the second terminal 72 of the first capacitive element 70.

Figure 8:
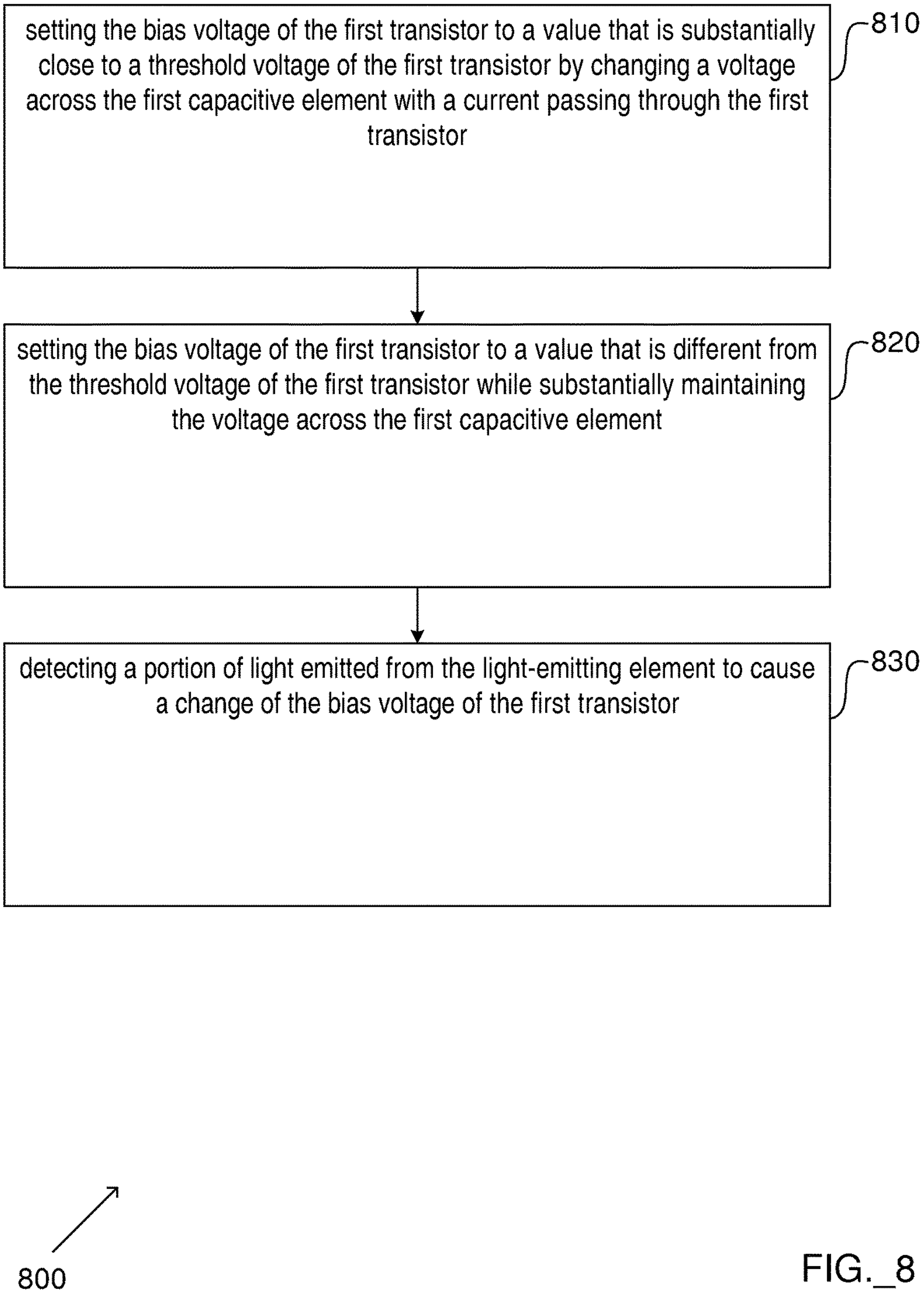
FIG. 8 shows an implementation of a method of driving a pixel element in a matrix of pixel elements.

FIG. 8 shows an implementation of a method 800 of driving a pixel element in a matrix of pixel elements. The pixel element includes (1) a first capacitive element, (2) a first transistor having a semiconductor channel, a first terminal of the semiconductor channel of the first transistor being electrically connected to a first terminal of the first capacitive element, and (3) a light-emitting element operationally coupled to the first transistor such that light emitted from the light-emitting element depends upon a bias voltage of the first transistor. Here, the bias voltage is a voltage difference between the gate of the first transistor and a first terminal of the semiconductor channel of the first transistor. In some implementations, the pixel element can also include a second transistor having a semiconductor channel operationally coupled to a second terminal of the semiconductor channel of the first transistor. The method 800 of driving a pixel element in a matrix of pixel elements includes blocks 810, 820, and 830.

Figure 9:
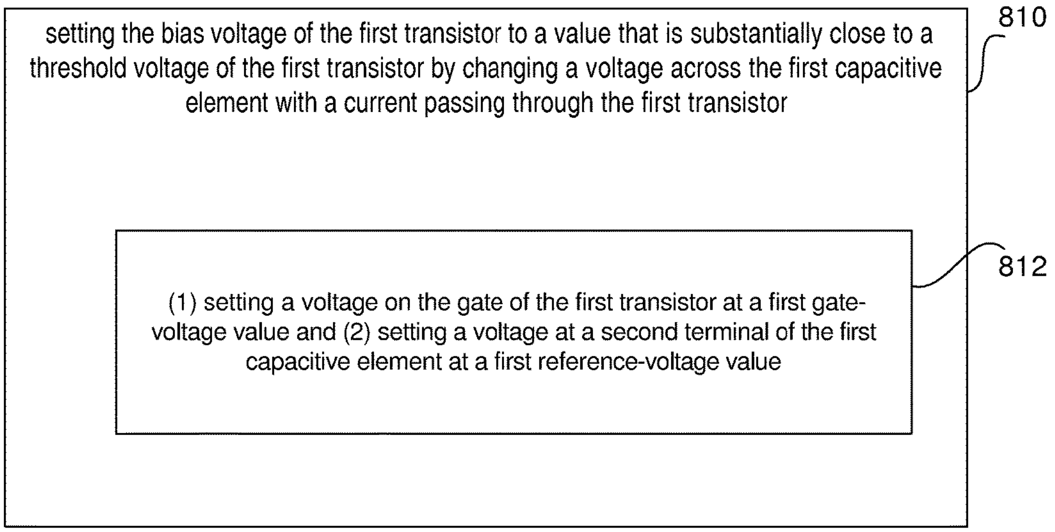
FIG. 9 shows an implementation for setting the bias voltage of the first transistor to a value that is substantially close to a threshold voltage of the first transistor.

The block 810 includes setting the bias voltage of the first transistor to a value that is substantially close to a threshold voltage of the first transistor by changing a voltage across the first capacitive element with a current passing through the first transistor. In one implementation as shown in FIG. 9, the block 810 includes a block 812. The block 812 includes (1) setting a voltage on the gate of the first transistor at a first gate-voltage value and (2) setting a voltage at a second terminal of the first capacitive element at a first reference-voltage value.

Figure 11:
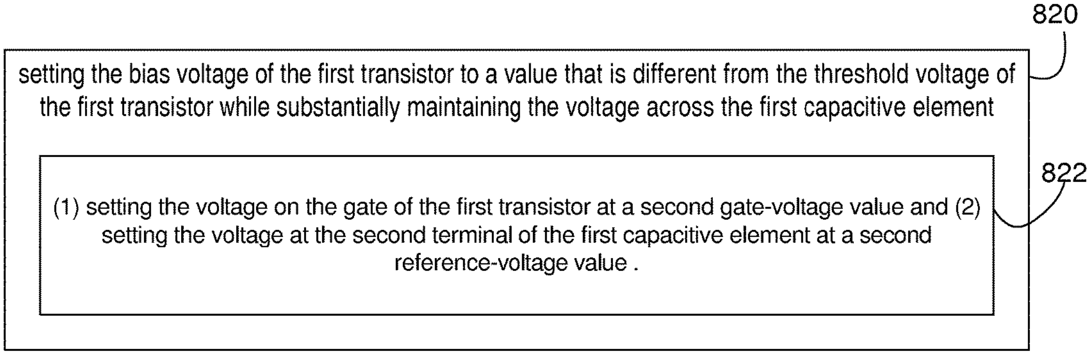
FIG. 11 shows an implementation for setting the bias voltage of the first transistor to a value that is different from the threshold voltage of the first transistor.

The block 820 includes setting the bias voltage of the first transistor to a value that is different from the threshold voltage of the first transistor while substantially maintaining the voltage across the first capacitive element. In one implementation as shown in FIG. 11, the block 820 includes a block 822. The block 822 includes (1) setting the voltage on the gate of the first transistor at a second gate-voltage value and (2) setting the voltage at the second terminal of the first capacitive element at a second reference-voltage value.

As examples, when the block 810 in FIG. 9 is applied to the pixel element as shown in FIGS. 6A-6D and FIGS. 7A-7D, the block 810 can include (1) setting a voltage on the gate of the first transistor 60 at a first gate-voltage value $V_{g1}$ and (2) setting a voltage at a second terminal of the first capacitive element 70 at a first reference-voltage value $V_{ref1}$. The voltage $V_{C1}$ across the first capacitive element 70 will be changed to a value $V_{C1} \approx V_{ref1}-(V_{g1}+V_{th})$, and the first transistor 60 will be biased near the threshold voltage $V_{th}$. When the block 820 in FIG. 11 is applied to the pixel element as shown in FIGS. 6A-6D and FIGS. 7A-7D, the block 820 can include (1) setting a voltage on the gate of the first transistor 60 at a second gate-voltage value $V_{g2}$ and (2) setting a voltage at a second terminal of the first capacitive element 70 at a second reference-voltage value $V_{ref2}$. If the voltage $V_{C1}$ across the first capacitive element 70 has been maintained at value $V_{C1} \approx V_{ref1}-(V_{g1}+V_{th})$, the block 820 will make the first transistor 60 biased at a value that is offset from the threshold voltage $V_{th}$ by an initial threshold offset $V^0_{offset}=|(V_{ref2}-V_{C1}-V_{g2})V_{th}|=|(V_{ref2}-V_{ref1})-(V_{g2}-V_{g1})|$. Later on, this initial threshold offset $V^0_{offset}$ can be used to substantially determine the total amount of light emitted from the light-emitting element 50.

In some implementations, the voltage at the gate of the first transistor 60 is kept at constant (i.e., $V_{g2}=V_{g1}$), and the initial threshold offset $V^0_{offset}$ is determined by the difference of the reference-voltage value at the second terminal of the first capacitive element 70: $V^0_{offset}=|(V_{ref2}-V_{ref1})|$. As a specific example, in FIG. 6C and FIG. 7C, $V_{g2}=V_{g1}=V_{GG}$, and $V^0_{offset}=|(V_{RR}-V_{ref1})|$. In other implementations, the voltage at the second terminal 72 of the first capacitive element 70 is kept at constant (i.e., $V_{ref2}=V_{ref1}$), and the initial threshold offset $V^0_{offset}$ is determined by the difference of the voltage at the gate of the first transistor 60: $V_{offset}=|(V_{g2}-V_{g1})|$. In some implementations, the second terminal 72 of the first capacitive element 70 can be connected to a common reference voltage $V_{REF}$ such that $V_{ref2}=V_{ref1}=V_{REF}$.

Figure 10A:
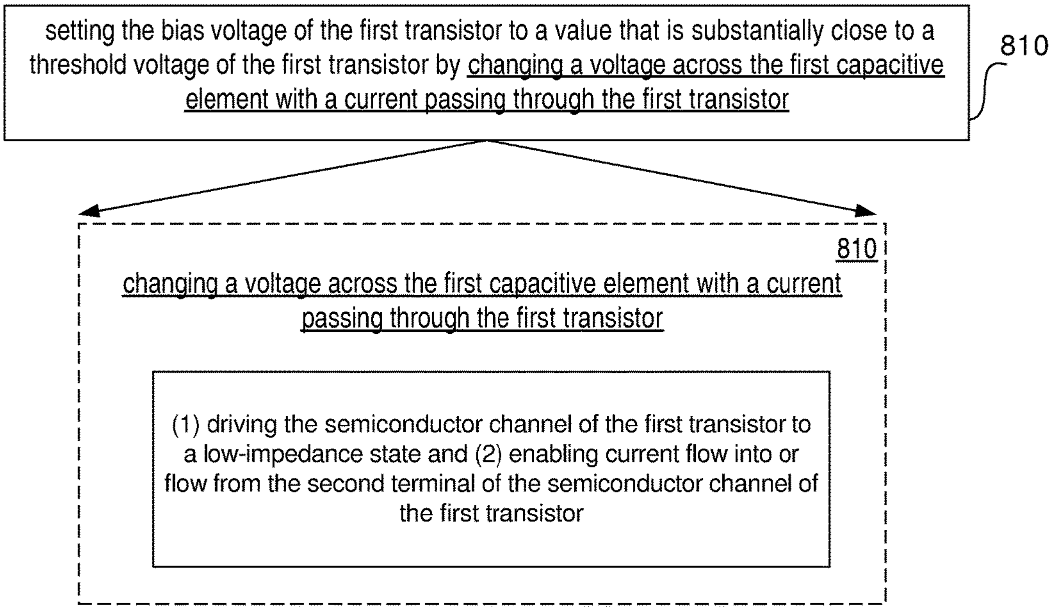
FIGS. 10A-10B illustrate the implementations for changing a voltage across the first capacitive element with a current passing through the first transistor.

In one implementation as shown in FIG. 10A, in the block 810, the changing a voltage across the first capacitive element with a current passing through the first transistor includes (1) driving the semiconductor channel of the first transistor to a low-impedance state and (2) enabling current flow into or flow from the second terminal of the semiconductor channel of the first transistor. As examples, if the block 810 in FIG. 10A is applied to the pixel element in FIGS. 7A-7D, when the multi-mode electrical circuit 180 is set into a first mode with a signal applied to the mode input 185, the multi-mode electrical circuit 180 enables current flow into or flow from the second terminal 62 of the semiconductor channel of the first transistor 60.

Figure 10B:
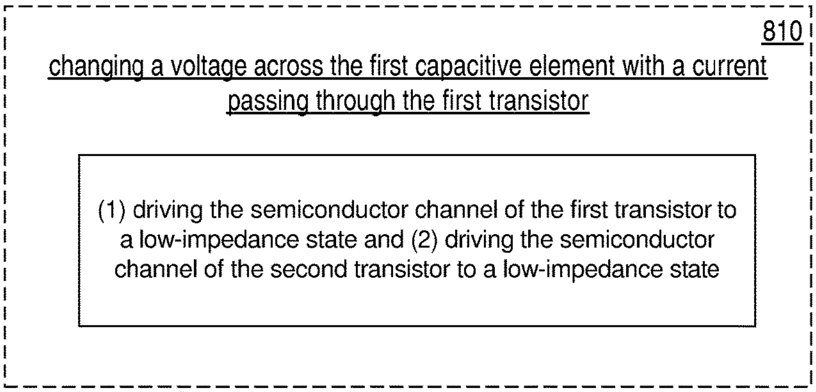

In one implementation as shown in FIG. 10B, in the block 810, the changing a voltage across the first capacitive element with a current passing through the first transistor includes (1) driving the semiconductor channel of the first transistor to a low-impedance state and (2) driving the semiconductor channel of the second transistor to a low-impedance state. As examples, if the block 810 in FIG. 10B is applied to the pixel element as shown in FIGS. 6A-6D, when both the first transistor 60 and the second transistor 80 are driven into the low-impedance state, the voltage $V_{C1}$ across the first capacitive element 70 will be changed with the current passing through the first transistor 60 until the bias voltage of the first transistor 60 is changed to a value near its threshold voltage.

Figure 12A:
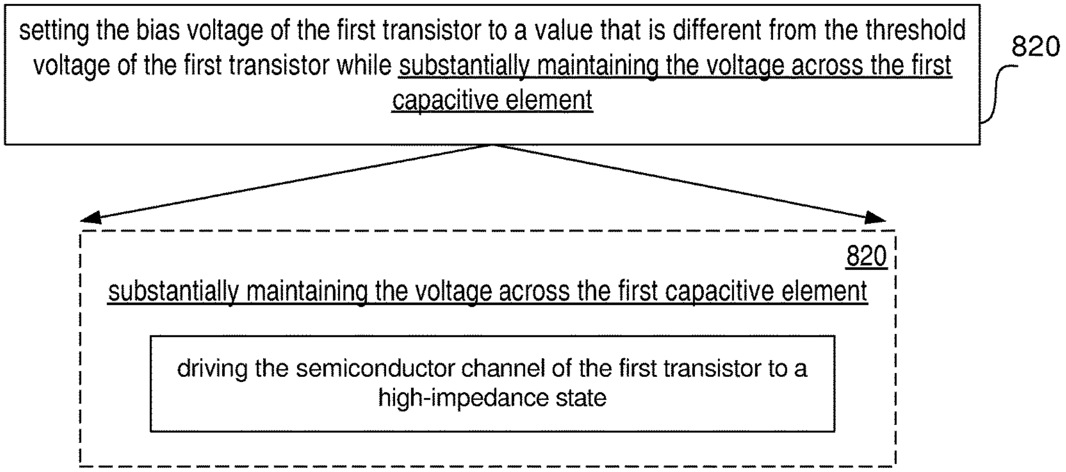
FIGS. 12A-12C illustrate the implementations for substantially maintaining the voltage across the first capacitive element.

In one implementation as shown in FIG. 12A, in the block 820, the substantially maintaining the voltage across the first capacitive element includes driving the semiconductor channel of the first transistor to a high-impedance state.

Figure 12B:
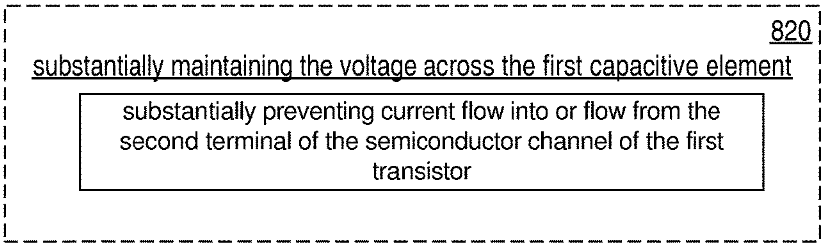

In one implementation as shown in FIG. 12B, in the block 820, the substantially maintaining the voltage across the first capacitive element includes substantially preventing current flow into or flow from the second terminal of the semiconductor channel of the first transistor. As examples, if the block 820 in FIG. 12B is applied to the pixel element in FIGS. 7A-7D, when the multi-mode electrical circuit 180 is set into a second mode with a signal applied to the mode input 185, the multi-mode electrical circuit 180 substantially prevents current flow into or flow from the second terminal 62 of the semiconductor channel of the first transistor 60.

Figure 12C:
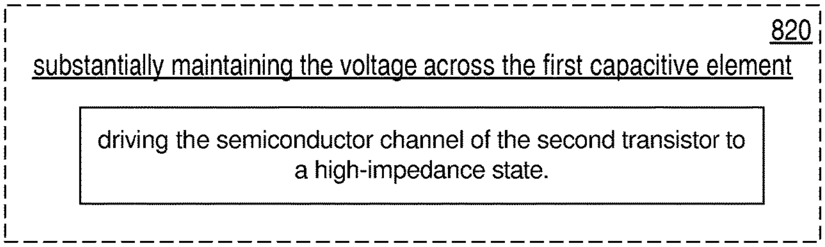

In one implementation as shown in FIG. 12C, in the block 820, the substantially maintaining the voltage across the first capacitive element includes driving the semiconductor channel of the second transistor to a high-impedance state.

The block 830 includes (1) detecting a portion of light emitted from the light-emitting element to cause a change of the bias voltage of the first transistor. As examples, when the block 830 in FIG. 9 is applied to the pixel element as shown in FIGS. 6A-6D and FIGS. 7A-7D, a portion of light emitted from the light-emitting element 50 can be detected by the photo-detecting element 90. The current generated by the photo-detecting element 90 can cause a change of the bias voltage of the first transistor 40.

Figure 13A:
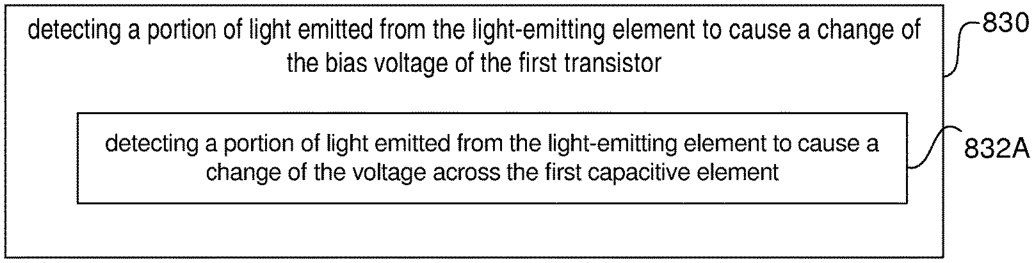
FIGS. 13A-13B illustrate the implementations for detecting a portion of light emitted from the light-emitting element to cause a change of the bias voltage of the first transistor.
Figure 13B:
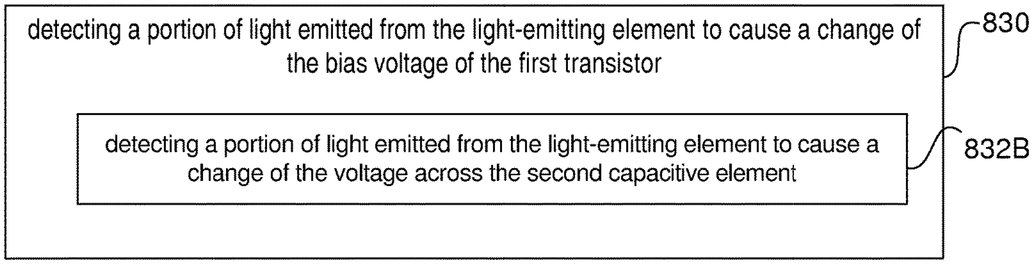

In one implementation as shown in FIG. 13A, the block 830 includes detecting a portion of light emitted from the light-emitting element to cause a change of the voltage across the first capacitive element. In another implementation as shown in FIG. 13B, when the pixel element includes a second capacitive element operationally coupled to a gate of the first transistor, the block 830 includes detecting a portion of light emitted from the light-emitting element to cause a change of the voltage across the second capacitive element.

In FIGS. 6A-6D and FIGS. 7A-7D, the pixel element includes a pixel sub-circuit 150. The pixel sub-circuit 150 has an input 151 electrically connected to the second terminal 62 of the semiconductor channel of the first transistor 60. Light emitted from the light-emitting element 50 in the pixel sub-circuit 150 depends upon a signal at the input of the pixel sub-circuit. FIGS. 14A-14D illustrate some implementations of the pixel sub-circuit 150.

Figure 14A:
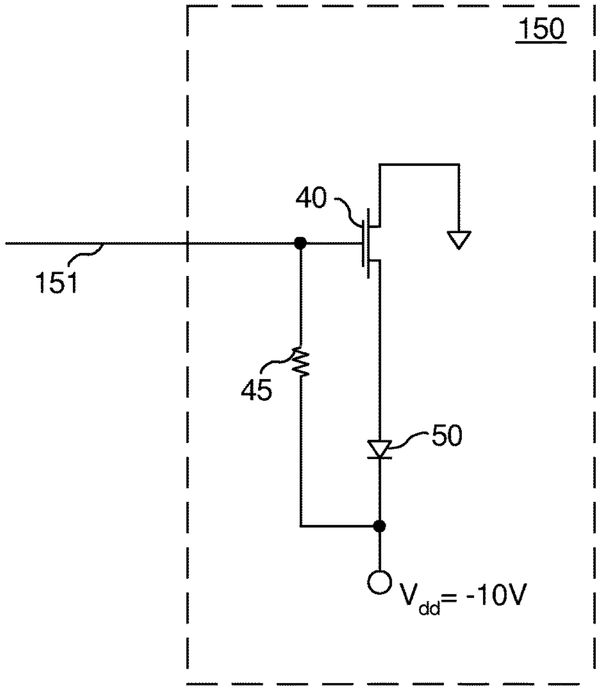
FIG. 14A is an implementation of the pixel sub-circuit 150 that is used in the pixel element in FIGS. 3A-3B.
Figure 14B:
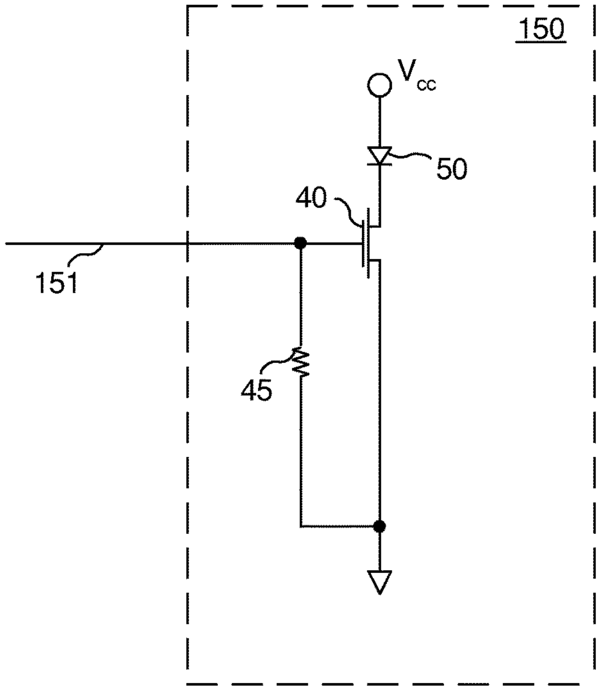
FIG. 14B is an implementation of the pixel sub-circuit 150 that is used in the pixel element in FIGS. 3C-3D.

FIG. 14A is an implementation of the pixel sub-circuit 150 that is used in the pixel element in FIGS. 3A-3B. In FIG. 14A, the pixel sub-circuit 150 includes a PFET and a light emitting diode 50. FIG. 14B is an implementation of the pixel sub-circuit 150 that is used in the pixel element in FIGS. 3C-3D. In FIG. 14B, the pixel sub-circuit 150 includes a NFET and a light emitting diode 50.

Figure 14C:
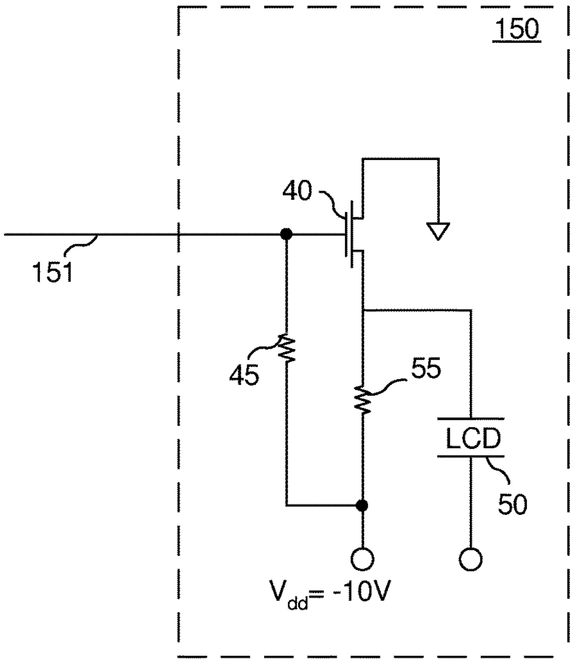
FIGS. 14C-14E are implementations of the pixel sub-circuit 150 that includes a high-impedance light-emitting element.
Figure 14D:
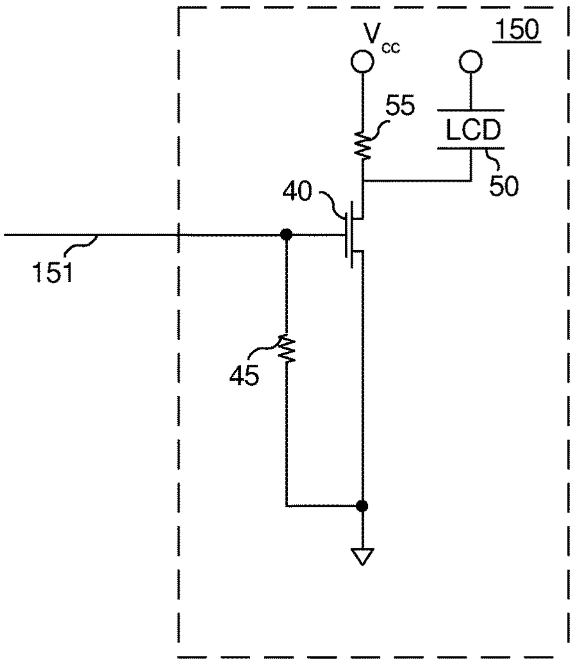
Figure 14E:
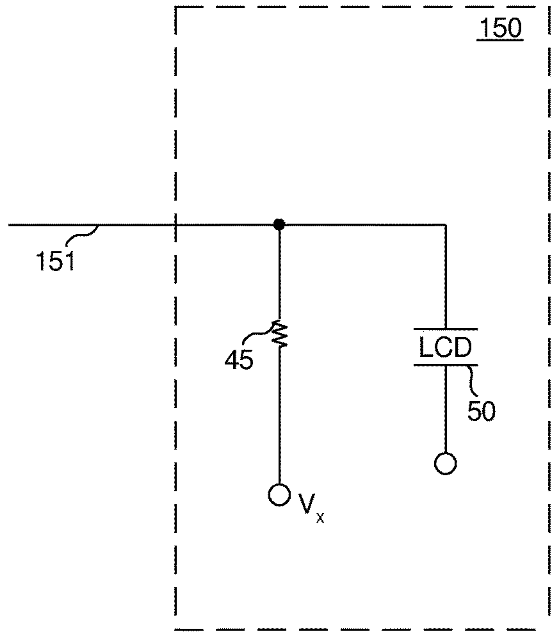

FIGS. 14C-14E are implementations of the pixel sub-circuit 150 that includes a high-impedance light-emitting element, such as a LCD cell 50 positioned in front of certain back lightening unit (e.g., a BLU, which is not shown in the figure). In FIGS. 14C-14D, the pixel sub-circuit 150 also includes a resistive element 55 electrically connected to the semiconductor channel of the driving transistor 40. The voltage at a terminal of the resistive element 55 is used to control the light intensity emitted from the LCD cell 50. In FIG. 14E, the voltage at the input 151 of the pixel sub-circuit 150 is used to control the light intensity emitted from the LCD cell 50. The pixel sub-circuit 150 can also include a resistive element 45 connected between the input 151 and a common voltage $V_X$.

When the pixel sub-circuit 150 in FIGS. 14C-14E are used for a pixel element in FIGS. 6A-6D and FIGS. 7A-7D, a portion of light emitted from the LCD cell 50 can be detected by the photo-detecting element 90. The current generated by the photo-detecting element 90 can cause a change of the bias voltage of the first transistor 40. In general, the light intensity emitted from the LCD cell 50 depends upon the light intensity of the back lightning unit and the transmission coefficient of the LCD cell 50. The transmission coefficient of the LCD cell 50 generally depends upon a voltage applied on the LCD cell 50, and this functional dependence generally can be characterized with a transmission coefficient curve. When the pixel sub-circuit 150 in FIGS. 14C-14E are used for a pixel element in FIGS. 6A-6D and FIGS. 7A-7D, variations of the transmission coefficient curve of the LCD cell 50 among different pixel elements can be compensated. The LCD cell 50 can be a nematic LCD cell, a ferroelectric LCD cell, or other kinds of high-impedance light-emitting element.

Figure 15A:
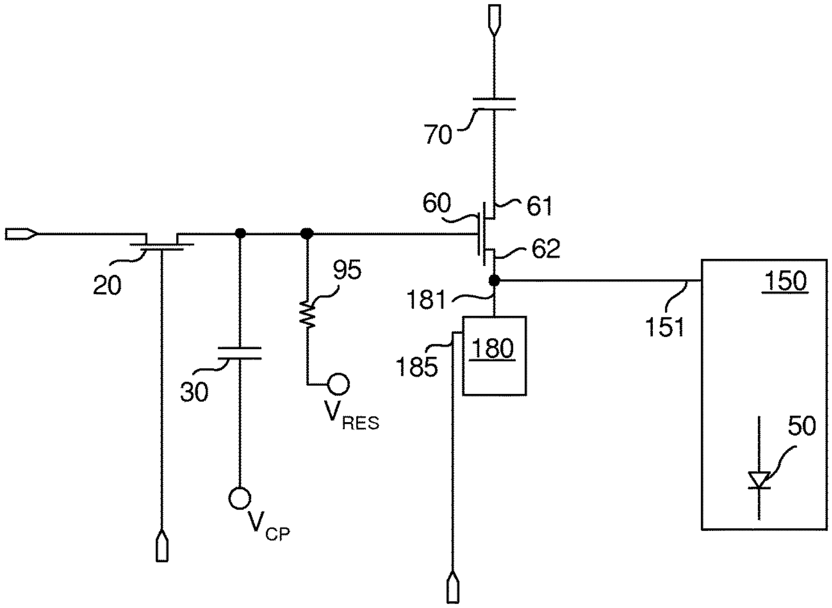
FIGS. 15A-15C are implementations of a pixel element that includes a resistive element operable to change the bias voltage of the first transistor with a current passing through the resistive element.
Figure 15B:
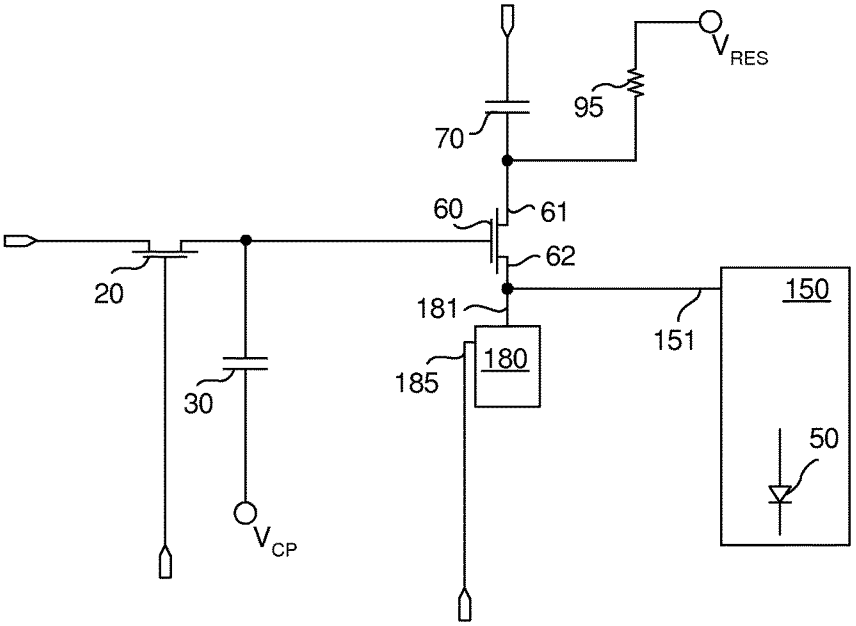
Figure 15C:
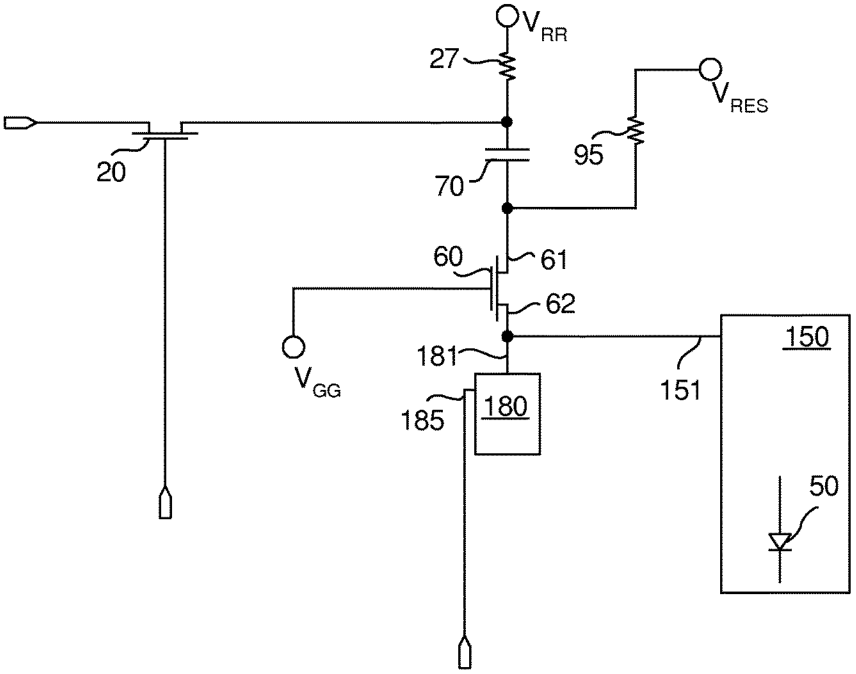

In FIGS. 6A-6D and FIGS. 7A-7D, the pixel element includes a photo-detecting element 90 operable to change the bias voltage of the first transistor 40 with the current generated by the photo-detecting element 90. In certain implementations, the pixel element does not include the photo-detecting element 90. For example, FIGS. 15A-15C illustrate other implementations of the pixel element (e.g., 100BB) that includes a resistive element 95 operable to change the bias voltage of the first transistor 40 with a current passing through the resistive element 95. In FIG. 15A, the resistive element 95 is electrically connected to the second capacitive element 30. In FIGS. 15B-15C, the resistive element 95 is electrically connected to the first capacitive element 70. The resistive element 95 can be biased with a bias voltage $V_{RES}$. In some implementations, the bias voltage $V_{RES}$ can be set to be identical to a common voltage, such as, the power voltage, or the ground voltage, or other common voltage.

Figure 16:
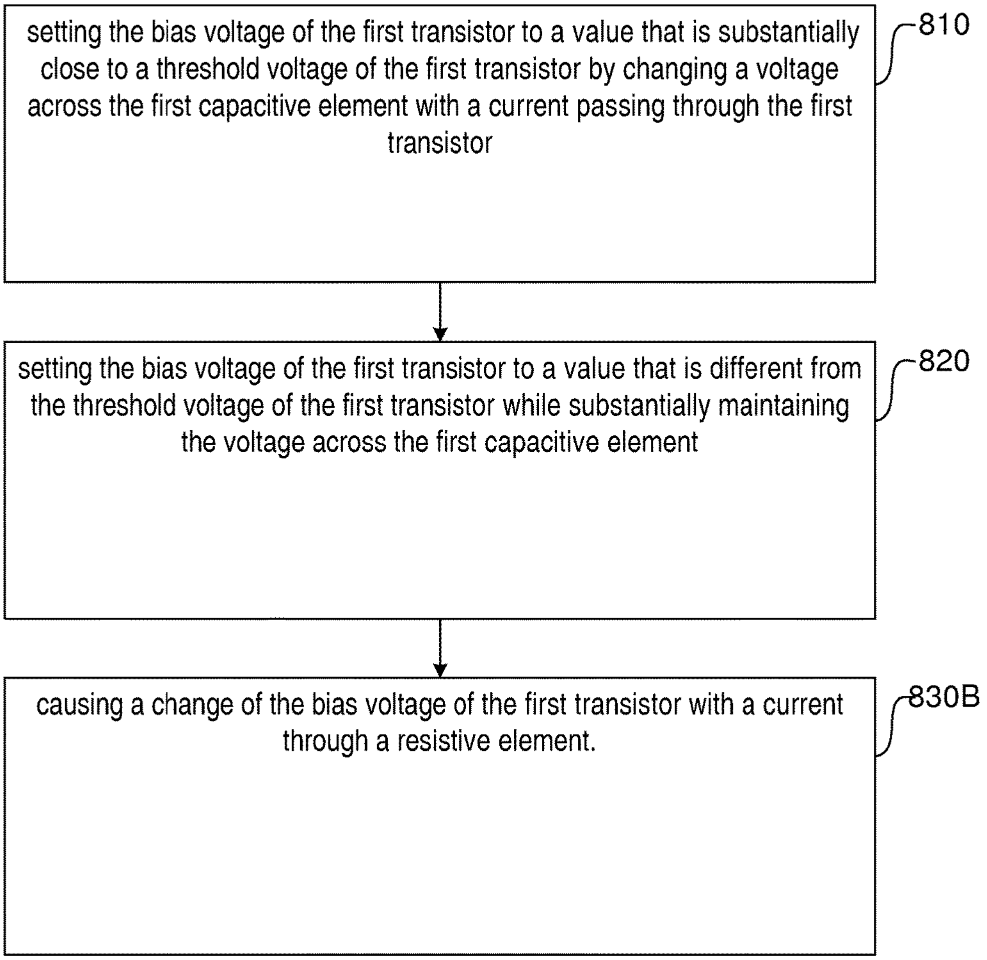
FIG. 16 shows another implementation of a method of driving a pixel element in a matrix of pixel elements.

FIG. 16 shows an implementation of a method 800B of driving a pixel element in a matrix of pixel elements. The pixel element includes (1) a first capacitive element, (2) a first transistor having a semiconductor channel, a first terminal of the semiconductor channel of the first transistor being electrically connected to a first terminal of the first capacitive element, and (3) a light-emitting element operationally coupled to the first transistor such that light emitted from the light-emitting element depends upon a bias voltage of the first transistor. Here, the bias voltage is a voltage difference between the gate of the first transistor and a first terminal of the semiconductor channel of the first transistor. In some implementations, the pixel element can also include a second transistor having a semiconductor channel operationally coupled to a second terminal of the semiconductor channel of the first transistor. Like the method 800 in FIG. 8, the method 800B in FIG. 16 also includes blocks 810 and 820. But unlike the method 800 in FIG. 8, which includes the block 830, the method 800B in FIG. 16 includes a block 830B.

The block 830B includes causing a change of the bias voltage of the first transistor with a current through a resistive element. As examples, when the block 830B in FIG. 16 is applied to the pixel element as shown in FIG. 15A, the current through the resistive element 95 can cause a change of the voltage on the gate of the first transistor 60 and consequently cause a change of the bias voltage of the first transistor 60. When the block 830B in FIG. 16 is applied to the pixel element as shown in FIGS. 15B-15C, the current through the resistive element 95 can cause a change of the voltage across the first capacitive element 70 and consequently cause a change of the bias voltage of the first transistor 60.

Generally, the current through the resistive element 95 can be a constant or can change with time. If this current is known or can be determined, it may be possible to determine the time duration that light is emitted from the light-emitting element 50 based on some initial conditions (e.g., one or more of the following: $V_{g1}$, $V_{g2}$, $V_{ref1}$, $V_{ref2}$, or $V^0_{offset}$). Furthermore, if the intensity of light emitted from the light-emitting element 50 during that time period is known, the total amount of light $L_{total}$ emitted from the light-emitting element 50 in each pixel element (e.g., 100AB) can also be determined from these initial conditions As an example, when the method 800B in FIG. 16 is applied to the pixel element as shown in FIG. 15A with a pixel sub-circuit 150 as shown in FIG. 14A or FIG. 14C, the time duration that light is emitted from the light-emitting element 50 can be determined by some initial conditions. In one simple implementation, assume that both the voltage $V_{CP}$ and the voltage $V_{RES}$ are designed to be identical to the ground voltage, and assume that when the blocks 810 and 820 are applied to the pixel element as shown in FIG. 15A, the voltage at the second terminal of the first capacitive element 70 is kept at constant (i.e., $V_{ref2}=V_{ref1}$). With such implementation, the initial threshold offset $V^0_{offset}$ is determined by the difference of the voltage at the gate of the first transistor 60: $V^0_{offset}=|(V_{g2}-V_{g1})|$.

During operation, when the block 810 is applied to the pixel element, the voltage on the gate of the first transistor 60 is set to $V_{g1}$, and the second capacitive element 30 is charged to the identical voltage $V_{g1}$; in addition, the bias voltage of the first transistor is changed to a value that is substantially close to a threshold voltage of the first transistor 60. Later on, when the block 820 is applied to the pixel element, the voltage on the gate of the first transistor 60 is set to $V_{g2}$, and the second capacitive element 30 is charged to the identical voltage $V_{g2}$; in addition, the bias voltage of the first transistor is set to a value that is different from the threshold voltage of the first transistor. When $V_{g2}$ is larger than $V_{g1}$, the first transistor 60 is driven into the high-impedance state. The current through the resistive element 95 can cause a change of the voltage across the second capacitive element 30. If the capacitance of the second capacitive element 30 is $C_g$, and the resistance of the resistive element 95 is $R_g$, then, the voltage across the second capacitive element 30 is $V_g(t)=V_{g2}[1-\exp(-t/\tau)]$, where $\tau=R_gC_g$.

When the voltage across the second capacitive element 30 is decreased to $V_{g1}$, the first transistor 60 will begin to change from the high-impedance state to the low impedance state. Therefore, the time duration T* that the first transistor 60 staying at the high-impedance state can be determined from equation, $T^*=\tau \ln [V_{g2}/(V_{g2}-V_{g1})]$. The time duration T* is also the time duration that light is emitted from the light-emitting element 50.

In certain implementations, the time duration T* can substantially determine the total amount of light $L_{total}$ emitted from the light-emitting element 50 in each pixel element. For example, when the pixel element in FIG. 15A is implemented with a pixel sub-circuit 150 in FIG. 14C, if the transmission coefficient of the LCD cell 50 is 100% when the first transistor 60 is at the high-impedance state and the transmission coefficient of the LCD cell 50 is 0% when the first transistor 60 is at the low-impedance state, then, the total amount of light $L_{total}$ emitted from the light-emitting element 50 is directly proportional to T*. That is, $L_{total}=T^*I_0$, where $I_0$ is the intensity of light emitted from the LCD cell 50 when the first transistor 60 is at the high-impedance state.

Both the method 800 in FIG. 8 and the method 800B in FIG. 16 are the method of driving a pixel element. Both the method 800 in FIG. 8 and the method 800B in FIG. 16 include causing a change of the bias voltage of the first transistor. In FIG. 8, the method 800 includes detecting a portion of light emitted from the light-emitting element to cause a change of the bias voltage of the first transistor. In FIG. 16, the method 800B includes causing a change of the bias voltage of the first transistor with a current through a resistive element. Other than the implementations in FIG. 8 and FIG. 16, there are other methods of causing a change of the bias voltage of the first transistor. For example, in one implementation, one of the methods of causing a change of the bias voltage of the first transistor can include monitoring a current flowing through the light-emitting element and causing a change of the bias voltage of the first transistor with a current that is proportional to the current flowing through the light-emitting element.

The present invention has been described in terms of a number of implementations. The invention, however, is not limited to the implementations depicted and described. Rather, the scope of the invention is defined by the appended claims.

Figure 17:
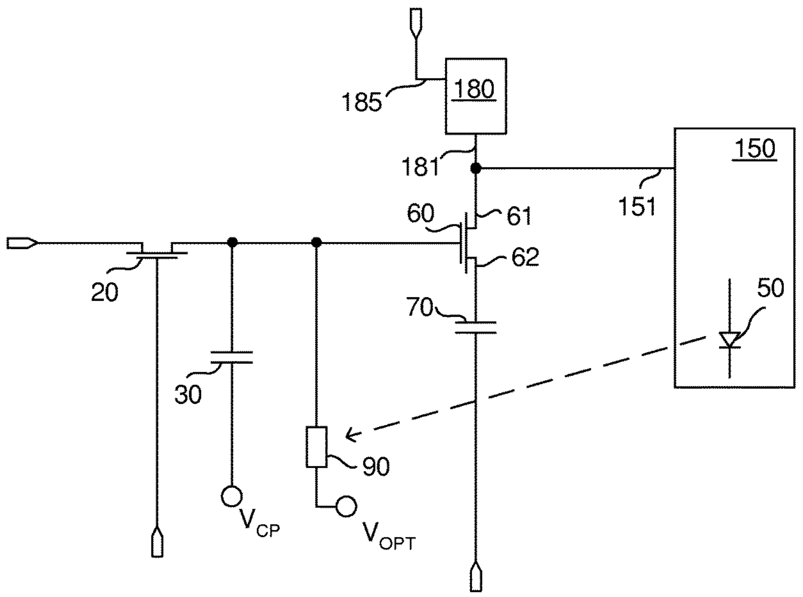
FIG. 17 shows an implementation of a pixel element in which the first transistor is a NFET.

In general, the driving transistor 40, the switching transistor 20, the first transistor 60, and the second transistor 80 can be a NFET or a PFET. For example, FIG. 17 shows an implementation of a pixel element (e.g., 100BB) in which the first transistor 60 is a NFET. In the appended claims, when an element A is electrically connected to an element B, generally, the element A can be physically connected to the element B directly, or the element A can be connected to the element B through one or more intermediate elements. Any element in a claim that does not explicitly state "means for" performing a specific function, or "step for" performing a specific function, is not to be interpreted as a "means" or "step" clause as specified in 35 U.S.C. §112, ¶6.

What is claimed is:

1. A method of driving a pixel element in a matrix of pixel elements of an active matrix display, the pixel element comprising (1) a first capacitive element, and (2) a first transistor having a semiconductor channel, a first terminal of the semiconductor channel of the first transistor being electrically connected to the first capacitive element via a first terminal of the first capacitive element, wherein the first transistor is biased at a bias voltage between a gate of the first transistor and the first terminal of the semiconductor channel of the first transistor, the active matrix display comprising an array of column conducting lines and an array of row conducting lines crossing the array of column conducting lines, the method comprising:

setting the bias voltage of the first transistor to a value that is substantially close to a threshold voltage of the first transistor, wherein said setting the bias voltage of the first transistor includes changing a voltage across the first capacitive element with a current that is substantially equal to the current passing through the semiconductor channel of the first transistor while (1) maintaining a direct (DC) current path between first terminal of the semiconductor channel of the first transistor and the first terminal of the first capacitive element and (2) keeping the first terminal of the first capacitive element electrically isolated from all other components in the pixel element when the semiconductor channel of the first transistor is conductive except for (i) the electrical connection through the semiconductor channel of the first transistor to all circuit components via the second terminal of the semiconductor channel of the first transistor and (ii) the capacitive electrical connection through the first capacitor's second terminal to all circuit components directly electrically connected to the same node as the first capacitor's second terminal; and after the bias voltage of the first transistor is set to a value that is substantially close to the threshold voltage of the first transistor, setting the bias voltage of the first transistor to a value that is different from the threshold voltage of the first transistor including changing a voltage difference that is the difference between the voltage on the gate of the first transistor and the voltage on a second terminal of the first capacitive element while substantially maintaining the voltage across the first capacitive element, wherein said changing a voltage difference includes having a voltage induced by one of the column conducting lines be applied to the gate of the first transistor through a semiconductor channel of a switching transistor while substantially maintaining the voltage across the first capacitive element.

2. The method of claim 1, wherein the changing a voltage across the first capacitive element with a current passing through the first transistor comprises:

(1) driving the semiconductor channel of the first transistor to a low-impedance state and (2) enabling current flow into or flow from the second terminal of the semiconductor channel of the first transistor.

3. The method of claim 1, wherein the substantially maintaining the voltage across the first capacitive element comprises:

driving the semiconductor channel of the first transistor to a high-impedance state.

4. The method of claim 1, wherein the substantially maintaining the voltage across the first capacitive element comprises:

substantially preventing current flow into or flow from the second terminal of the semiconductor channel of the first transistor.

5. The method of claim 1, wherein the pixel element comprises a second capacitive element operationally coupled to a gate of the first transistor such that a voltage on the gate of the first transistor depends upon a voltage across the second capacitive element.

6. The method of claim 1, further comprising:

changing of the bias voltage of the first transistor back towards the threshold voltage of the first transistor while a light-emitting element is having a light emission.

7. The method of claim 1, wherein the first transistor is in a high-impedance state after the bias voltage of the first transistor is set to a value that is different from the threshold voltage, the method further comprising:

changing the bias voltage of the first transistor back towards the threshold voltage to driven the first transistor out of the high-impedance state; and causing a light-emitting element to cease a light emission when the first transistor is driven out of the high-impedance state.

8. The method of claim 1, wherein the first transistor is in a low-impedance state after the bias voltage of the first transistor is set to a value that is different from the threshold voltage, the method further comprising:

changing the bias voltage of the first transistor back towards the threshold voltage to driven the first transistor out of the low-impedance state; and causing a light-emitting element to cease emitting light when the first transistor is driven out of the low-impedance state.

9. The method of claim 1, wherein the first terminal of the semiconductor channel of the first transistor is directly connected to the first terminal of the first capacitive element in series without any intervening circuit element except for a connecting conductor.

10. The method of claim 1, further comprising:

step for causing a light-emitting element to emit light; and step for causing the bias voltage of the first transistor to affect the light emitted from the light-emitting element at least momentarily.

11. The method of claim 10, further comprising:

detecting a portion of light emitted from the light-emitting element to cause a change of the bias voltage of the first transistor.

12. The method of claim 1, wherein the pixel element further comprises a second transistor having a semiconductor channel conductively connected to a second terminal of the semiconductor channel of the first transistor.

13. The method of claim 12, wherein the changing a voltage across the first capacitive element with a current passing through the first transistor comprises:

(1) driving the semiconductor channel of the first transistor to a low-impedance state and (2) driving the semiconductor channel of the second transistor to a low-impedance state.

14. The method of claim 12, wherein the substantially maintaining the voltage across the first capacitive element comprises:

driving the semiconductor channel of the second transistor to a high-impedance state.

15. The method of claim 1, further comprising:

after the bias voltage of the first transistor is set to a value that is different from the threshold voltage of the first transistor, step for causing a change of the bias voltage of the first transistor while a light-emitting element is caused to emit light.

16. The method of claim 15, wherein the step for causing a change of the bias voltage of the first transistor comprises:

causing a change of the bias voltage of the first transistor with a current generated by a photo-detecting element.

17. The method of claim 15, wherein the step for causing a change of the bias voltage of the first transistor comprises:

monitoring a current flowing through the light-emitting element; and causing a change of the bias voltage of the first transistor with a current that is proportional to the current flowing through the light-emitting element.

18. A method of driving a pixel element in a matrix of pixel elements of an active matrix display, the pixel element comprising (1) a first capacitive element, (2) a first transistor having a semiconductor channel, and electrical means for connecting a first terminal of the semiconductor channel of the first transistor to a first terminal of the first capacitive element, wherein the first transistor is biased at a bias voltage between a gate of the first transistor and the first terminal of the semiconductor channel of the first transistor, the active matrix display comprising an array of column conducting lines and an array of row conducting lines crossing the array of column conducting lines, the method comprising:

step for setting the bias voltage of the first transistor to a value that is substantially close to a threshold voltage of the first transistor by changing a voltage across the first capacitive element to a first capacitive-voltage value while keeping the first terminal of the semiconductor channel of the first transistor conductively connected to the first capacitive element via the first terminal of the first capacitive element; and after the bias voltage of the first transistor is set to a value that is substantially close to the threshold voltage of the first transistor, setting the bias voltage of the first transistor to a value that is different from the threshold voltage of the first transistor while substantially maintaining the voltage across the first capacitive element at the first capacitive-voltage value and keeping the first terminal of the semiconductor channel of the first transistor conductively connected to the first capacitive element via the first terminal of the first capacitive element, wherein said setting the bias voltage of the first transistor to a value that is different from the threshold voltage includes having a voltage induced by one of the column conducting lines be applied to the gate of the first transistor through a semiconductor channel of a switching transistor while substantially maintaining the voltage across the first capacitive element.

19. The method of claim 18, further comprising:

step for causing a light-emitting element to emit light; and step for causing the bias voltage of the first transistor to affect the light emitted from the light-emitting element at least momentarily.

20. The method of claim 19, further comprising:

detecting a portion of light emitted from the light-emitting element to cause a change of the bias voltage of the first transistor.

21. An active matrix display comprising:

an array of column conducting lines (200);

an array of row conducting lines crossing the array of column conducting lines; and a matrix of pixel elements, wherein a pixel element (100) is electrically connected to at least one column conducting line and at least one row conducting line, and wherein the pixel element comprises:

a first capacitive element (70) having a first terminal and a second terminal, a first transistor (60) having a semiconductor channel, a first terminal (61) of the semiconductor channel of the first transistor (60) being electrically connected to the first terminal (71) of the first capacitive element (70) to allow a direct (DC) current formed path between the first terminal of the semiconductor channel of the first transistor and the first terminal of the first capacitive element, wherein the gate of the first transistor and the second terminal of the first capacitive element are essentially decoupled from each other electrically within the pixel element at least momentarily to allow a first voltage be applied to the gate of the first transistor and a second voltage be applied to the second terminal of the first capacitive element separately, a second transistor (80) having a semiconductor channel with the semiconductor channel of the first transistor (60) electrically connected between the first capacitive element (70) and the semiconductor channel of the second transistor (80), a second capacitive element (30) having a first terminal (31) electrically connected to a gate of the first transistor (60), a switching transistor (20) having a semiconductor channel electrically connected between the first terminal (31) of the second capacitive element (30) and a column conducting line (200B) line to allow the first voltage be applied to the gate of the first transistor through the semiconductor channel of the switching transistor by the column conducting line, the switching transistor (20) having a gate electrically connected to a first row conducting line (301B), and wherein the second transistor (80) has the gate thereof electrically connected to a second row conducting line (302B) to allow the semiconductor channel of the switching transistor (20) be set into conducting state with a voltage signal applied on the second row conducting line (302B).

22. The active matrix display of claim 21, wherein the first capacitive element (70) and the semiconductor channel of the first transistor (60) are electrically connected in serial between a third row conducting line (303B) and the semiconductor channel of the second transistor (80).

23. The active matrix display of claim 21, wherein the first capacitive element (70), the semiconductor channel of the first transistor (60), and the semiconductor channel of the second transistor (80) are all electrically connected in serial between a third row conducting line (303B) and a voltage terminal.

24. The active matrix display of claim 21, wherein the semiconductor channel of the switching transistor (20) is directly connected to the gate of the first transistor (60) establishing a direct current (DC) path from the semiconductor channel of the switching transistor (20) to the gate of the first transistor (60).

25. The active matrix display of claim 21, wherein the pixel element comprises:

a driving transistor (40) having a gate electrically connected to the second terminal (62) of the semiconductor channel of the first transistor (60), and a light-emitting element (50) electrically connected to a semiconductor channel of the driving transistor (40).

26. The active matrix display of claim 25, wherein the pixel element further comprises:

a photo-detecting element (90) electrically connected to the second capacitive element and receiving a portion of the light emitted from the light-emitting element.

27. The active matrix display of claim 25, wherein the pixel element further comprises:

a photo-detecting element (90) electrically connected to the first capacitive element and receiving a portion of the light emitted from the light-emitting element.

* * * * *